(12) United States Patent
Kayaba et al.

(10) Patent No.: US 10,020,238 B2
(45) Date of Patent: Jul. 10, 2018

(54) METHOD FOR MANUFACTURING COMPOSITE BODY AND COMPOSITION

(71) Applicant: MITSUI CHEMICALS, INC., Minato-ku, Tokyo (JP)

(72) Inventors: Yasuhisa Kayaba, Sodegaura (JP); Shoko Ono, Ichihara (JP); Hirofumi Tanaka, Sodegaura (JP); Tsuneji Suzuki, Chiba (JP); Shigeru Mio, Chiba (JP); Kazuo Kohmura, Iwakuni (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 105 days.

(21) Appl. No.: 14/779,757

(22) PCT Filed: Mar. 11, 2014

(86) PCT No.: PCT/JP2014/056340
§ 371 (c)(1),
(2) Date: Sep. 24, 2015

(87) PCT Pub. No.: WO2014/156616
PCT Pub. Date: Oct. 2, 2014

(65) Prior Publication Data
US 2016/0049343 A1 Feb. 18, 2016

(30) Foreign Application Priority Data

Mar. 27, 2013 (JP) .................................. 2013-067452
Aug. 30, 2013 (JP) .................................. 2013-179751

(51) Int. Cl.
*H01L 21/00* (2006.01)
*H01L 23/29* (2006.01)
(Continued)

(52) U.S. Cl.
CPC ........ *H01L 23/293* (2013.01); *C08G 73/0206* (2013.01); *C08K 5/0091* (2013.01);
(Continued)

(58) Field of Classification Search
CPC ..... H01L 23/29; H01L 23/528; H01L 23/532; H01L 21/02; H01L 21/56; C09J 179/04
See application file for complete search history.

(56) References Cited

U.S. PATENT DOCUMENTS

| 6,288,197 B1 | 9/2001 | Youngs et al. |
| 2005/0085404 A1 | 4/2005 | Yoneda et al. |

(Continued)

FOREIGN PATENT DOCUMENTS

| EP | 2876675 A1 | 5/2015 |
| JP | 2002-513047 A | 5/2002 |

(Continued)

OTHER PUBLICATIONS

Parks, George A. (The Isoelectric Points of Solid Oxides, Solid Hydroxides, and Aqueous Hydroxo Complex Systems Chemical Review, Apr. 1965, vol. 65, No. 2, pp. 177-198).*

(Continued)

*Primary Examiner* — Charles Garber
*Assistant Examiner* — Abdulfattah Mustapha
(74) *Attorney, Agent, or Firm* — Buchanan, Ingersoll & Rooney PC

(57) ABSTRACT

Provided is a method for manufacturing a composite body, the method containing: a composition preparation process of preparing a composition that contains a polymer having a cationic functional group and having a weight average molecular weight of from 2,000 to 1,000,000, and that has a pH of from 2.0 to 11.0; a composite member preparation process of preparing a composite member that includes a member A and a member B, a surface of the member B
(Continued)

having a defined isoelectric point, and that satisfies a relationship: the isoelectric point of a surface of the member B< the pH of the composition<the isoelectric point of a surface of the member A; and an application process of applying the composition to the surface of the member A and the surface of the member B included in the composite member.

17 Claims, 4 Drawing Sheets

(51) Int. Cl.
- *C08L 79/02* (2006.01)
- *H01L 21/02* (2006.01)
- *C08K 5/00* (2006.01)
- *C08G 73/02* (2006.01)
- *C09J 179/04* (2006.01)
- *H01L 21/56* (2006.01)
- *H01L 23/528* (2006.01)
- *H01L 23/532* (2006.01)

(52) U.S. Cl.
CPC ............ *C08L 79/02* (2013.01); *C09J 179/04* (2013.01); *H01L 21/0206* (2013.01); *H01L 21/02118* (2013.01); *H01L 21/02282* (2013.01); *H01L 21/56* (2013.01); *H01L 23/528* (2013.01); *H01L 23/5329* (2013.01); *H01L 23/53209* (2013.01); *H01L 2924/0002* (2013.01)

(56) References Cited

U.S. PATENT DOCUMENTS

| | | | |
|---|---|---|---|
| 2011/0241210 A1 | 10/2011 | Ono et al. | |
| 2013/0094082 A1* | 4/2013 | Yamazaki | G02B 1/105 |
| | | | 359/483.01 |
| 2013/0171826 A1 | 6/2013 | Ono et al. | |

FOREIGN PATENT DOCUMENTS

| | | | | |
|---|---|---|---|---|
| JP | 2004-146495 A | 5/2004 | | |
| JP | 2005-350640 A | 12/2005 | | |
| JP | WO 2012033172 A1 | * 3/2012 | ....... | H01L 21/02063 |
| WO | WO 2010/137711 A1 | 12/2010 | | |
| WO | WO 2012/033172 A1 | 3/2012 | | |
| WO | WO 2014/013956 A1 | 1/2014 | | |

OTHER PUBLICATIONS

International Search Report (PCT/ISA/210) dated Jun. 17, 2014, by the Japanese Patent Office as the International Searching Authority for International Application No. PCT/JP2014/056340.
Written Opinion (PCT/ISA/237) dated Jun. 17, 2014, by the Japanese Patent Office as the International Searching Authority for International Application No. PCT/JP2014/056340.
Parks, "The Isoelectric Points of Solid Oxides, Solid Hydroxides, and Aqueous Hydroxo Complex Systems", Chemical Review,Apr. 1965, vol. 65, No. 2, pp. 177-198.
Extended Search Report issued by the European Patent Office in corresponding European Patent Application No. 14773360.4 dated Sep. 16, 2016 (7 pages).
Office Action issued by the Korean Patent Office in corresponding Korean Patent Application No. 2015-7026071 dated Oct. 17, 2016 (16 pages including partial English translation).

* cited by examiner

METHOD FOR MANUFACTURING COMPOSITE BODY AND COMPOSITION

TECHNICAL FIELD

The present invention relates to a method for manufacturing a composite body, and a composition.

BACKGROUND ART

Conventionally, in various technical fields such as the field of electronic devices, application of a composition containing a polymer to a member has been conducted.

For example, a technique of applying a semiconductor composition that contains a polymer having two or more cationic functional groups and having a weight average molecular weight of from 2,000 to 100,000, to an interlayer insulating layer of a semiconductor device is known (see, for example, International Publication (WO) 2010/137711).

DISCLOSURE OF INVENTION

Technical Problem

Incidentally, when applying a polymer to each of the members of a composite member including two or more kinds of members, there are cases in which the polymer is required to remain preferentially (preferably, selectively) on a specific member. An example of such a composite member is a composite member including an insulating layer as a member and a conductive part (for example, a wiring, an electrode, or the like) as other member. In the case of applying a polymer to the composite member according to this example, it is required that the polymer remains on the insulating layer as much as possible, to protect the insulating layer and, at the same time, the polymer does not remain on the conductive part as much as possible, to maintain the electrical connectivity in the surface of the conductive part. Accordingly, when applying a polymer to the composite member, it is required to achieve both the ease of remaining the polymer on the insulating layer and the difficulty of remaining the polymer on the conductive part.

The invention has been made in view of the above circumstances.

Namely, an aspect of the invention is to provide a method for manufacturing a composite body that can achieve both the ease of remaining the polymer on a specific member and the difficulty of remaining the polymer on other member, in the manufacture of a composite body by applying a polymer to the surface of a composite member including two or more kinds of members, the composite body being equipped with the composite member and the polymer.

Further, another aspect of the invention is to provide a composition containing a polymer, in which the composition can achieve both the ease of remaining the polymer on a specific member and the difficulty of remaining the polymer on other member, when applied to two or more kinds of composite members.

Solution to Problem

Specific means for addressing the above problems are as follows.

<1> A method for manufacturing a composite body, the method containing:

a composition preparation process of preparing a composition that contains a polymer having a cationic functional group and having a weight average molecular weight of from 2,000 to 1,000,000, and that has a pH of from 2.0 to 11.0;

a composite member preparation process of preparing a composite member that includes a member A and a member B, a surface of the member B having an isoelectric point that is lower than an isoelectric point of a surface of the member A by 2.0 or more and the isoelectric point of the member B being from 1.0 to 7.5, and that satisfies a relationship: the isoelectric point of a surface of the member B<the pH of the composition<the isoelectric point of a surface of the member A; and an application process of applying the composition to the surface of the member A and the surface of the member B included in the composite member.

<2> The method for manufacturing a composite body according to <1>, wherein the member A contains at least one element selected from the group consisting of Cu, Al, Ti, Ni, Fe, Sn, Cr, Mn, Pt, Zn and Mg, and the member B contains silica.

<3> The method for manufacturing a composite body according to <1> or <2>, wherein the member A contains Cu, and the member B contains silica.

<4> The method for manufacturing a composite body according to any one of <1> to <3>, wherein a content of sodium and a content of potassium in the composition are each 10 ppb by mass or less, on an elemental basis.

<5> The method for manufacturing a composite body according to any one of <1> to <4>, the method further comprising a heating process of heating the composite member to which the composition has been applied, under a condition of a temperature of from 70° C. to 125° C.

<6> The method for manufacturing a composite body according to any one of <1> to <5>, wherein the member B contains a porous material.

<7> The method for manufacturing a composite body according to any one of <1> to <6>, wherein the polymer has a cationic functional group equivalent weight of from 27 to 430.

<8> The method for manufacturing a composite body according to any one of <1> to <7>, wherein the polymer is a polyethyleneimine or a derivative of a polyethyleneimine.

<9> The method for manufacturing a composite body according to any one of <1> to <8>, wherein the polymer has a branching degree of 48% or more.

<10> The method for manufacturing a composite body according to any one of <1> to <9>, wherein the composition further contains a monocarboxylic acid compound.

<11> The method for manufacturing a composite body according to <10>, wherein the monocarboxylic acid compound does not have a hydroxyl group or an amino group, and has a van der Waals volume of 40 $cm^3$/mol or more.

<12> The method for manufacturing a composite body according to any one of <1> to <11>, wherein the composite member satisfies a relationship: the isoelectric point of a surface of the member B<the pH of the composition<{(the isoelectric point of a surface of the member A)−1.0}.

<13> The method for manufacturing a composite body according to any one of <1> to <12>, the method further comprising a cleaning process of cleaning the composite member to which the composition has been applied, with a rinsing liquid at a temperature of from 15° C. to 100° C.

<14> The method for manufacturing a composite body according to <13>, wherein the rinsing liquid comprises an acid having, in one molecule, at least one of a moiety that blocks active species or a functional group that forms a bond with the polymer when heated.

<15> The method for manufacturing a composite body according to any one of <1> to <14>, the method further comprising a high temperature heating process of heating the composite member to which the composition has been applied, under a condition of a temperature of from 200° C. to 425° C.

<16> The method for manufacturing a composite body according to any one of <1> to <15>, wherein the composite member comprises a substrate and, on the substrate, a conductive part as the member A and an insulating layer as the member B.

<17> A composition that comprises a polymer having a cationic functional group and having a weight average molecular weight of from 2,000 to 1,000,000 and a branching degree of 48% or more, and that has a pH of from 2.0 to 11.0, wherein a content of sodium and a content of potassium in the composition are each 10 ppb by mass or less, on an elemental basis.

<18> The composition according to <17>, further comprising a monocarboxylic acid compound.

<19> The composition according to <17> or <18>, being a semiconductor sealing composition.

Advantageous Effects of Invention

According to the invention, a method for manufacturing a composite body that can achieve both the ease of remaining the polymer on a specific member and the difficulty of remaining the polymer on other member, in the manufacture of a composite body by applying a polymer to the surface of a composite member including two or more kinds of members, the composite body being equipped with the composite member and the polymer, may be provided.

Further, according to the invention, a composition containing a polymer, in which the composition can achieve both the ease of remaining the polymer on a specific member and the difficulty of remaining the polymer on other member, when applied to two or more kinds of composite members, may be provided.

DESCRIPTION OF EMBODIMENTS

Figure 1:
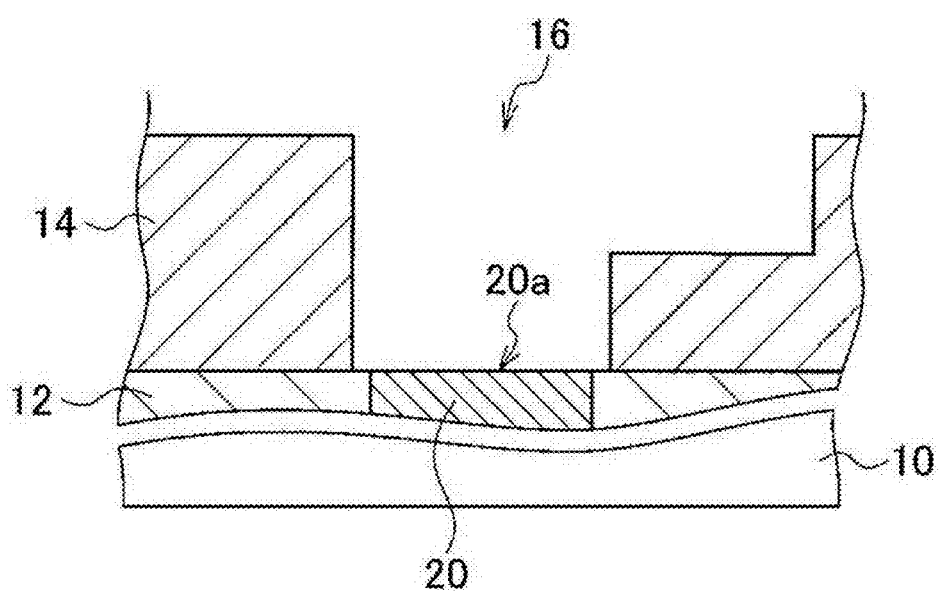
FIG. 1 is a conceptual sectional diagram schematically showing a cross section of a composite member, in one example of the manufacturing method according to the invention.

Hereinafter, the method for manufacturing a composite body of the invention is described, and in this description, the composition of the invention is also described.

<<Method for Manufacturing Composite Body>>

The method for manufacturing a composite body of the invention (hereinafter, also referred to as the "manufacturing method of the invention") has a composition preparation process of preparing a composition that contains a polymer having a cationic functional group and having a weight average molecular weight of from 2,000 to 1,000,000, and that has a pH of from 2.0 to 11.0; a composite member preparation process of preparing a composite member that includes a member A and a member B, a surface of the member B having an isoelectric point that is lower than an isoelectric point of a surface of the member A by 2.0 or more and the isoelectric point of the member B being from 1.0 to 7.5, and that satisfies a relationship: the isoelectric point of a surface of the member B<the pH of the composition<the isoelectric point of a surface of the member A; and an application process of applying the composition to the surface of the member A and the surface of the member B included in the composite member. The manufacturing method of the invention may have other process, if necessary.

According to the manufacturing method of the invention, a method for manufacturing a composite body that can achieve both the ease of remaining the polymer on a specific member (member B) and the difficulty of remaining the polymer on other member (member A), in the manufacture of a composite body by applying a polymer to the surface of a composite member equipped with two or more kinds of members (member A and member B), the composite body being equipped with the composite member and the polymer, may be provided.

In the following, the expression "can achieve both the ease of remaining the polymer on the member B and the difficulty of remaining the polymer on the member A" is also expressed as "can improve the selectivity in remaining the polymer on the member B".

Moreover, in the following, "achieve the ease of remaining" is also expressed as "have excellent persistent quality".

The reason why such an effect can be obtained is guessed as follows; however, it should be construed that the invention is not limited to the following reason.

Namely, it is thought that, in the manufacturing method of the invention, when the pH of the composition is within the range of from 2.0 to 11.0 and the relationship: the isoelectric point of a surface of the member B<the pH of the composition<the isoelectric point of a surface of the member A is satisfied, an electrostatic attractive force (hereinafter, also referred to as, simply, an "attractive force") tends to work between the polymer, which is included in the composition and has a cationic functional group, and the surface (namely, the surface that easily becomes negatively charged, as compared with the surface of the member A) of the member B, which has an isoelectric point that is lower than an isoelectric point of a surface of the member A by 2.0 or more and the isoelectric point of the member B is from 1.0 to 7.5 and, at the same time, an electrostatic repulsive force (hereinafter, also referred to as, simply, a "repulsive force") tends to work between the polymer included in the composition and the surface of the member A which has an isoelectric point that is higher than an isoelectric point of a surface of the member B by 2.0 or more.

Specifically, it is thought that, when the pH of the composition is 2.0 or higher and the relationship "the isoelectric point of a surface of the member B<the pH of the composition" is satisfied, the surface of the member B described above easily becomes negatively charged and, as a result, an attractive force tends to work between the surface of the member B and the cationic functional group possessed by the polymer. Further, it is thought that, when the pH of the composition is 11.0 or lower and the relationship "the pH of the composition<the isoelectric point of a surface of the member A" is satisfied, the surface of the member A described above easily becomes positively charged and, as a result, a repulsive force tends to work between the surface of the member A and the cationic functional group possessed by the polymer.

It is guessed that these attractive force and repulsive force have a relationship with the zeta potential in the interface between the composition and the member A, and the zeta potential in the interface between the composition and the member B.

Note that, in the invention, the pH of the composition indicates the value measured at 25° C.

According to the manufacturing method of the invention, as described above, both the ease of remaining the polymer on the member B and the difficulty of remaining the polymer on the member A can be achieved.

That is, after the application process, the polymer easily remains on the member B, but the polymer hardly remains on the member A. Further, even if the polymer has remained on the member A after the application process, by successively performing an ordinary removal process (a commonly used cleaning treatment, a high temperature heat treatment described below, or the like), at least a part of the polymer that has remained on the member A can be easily removed, and the polymer can remain preferentially (preferably, selectively) on the member B.

Since the polymer that has been applied to the member A is less likely to remain, the electrical connection in the surface (in a case in which the polymer is removed, the area exposed by the removal) of the member A becomes excellent. Here, examples of the electrical connection include a connection between this member A and other member (a wiring, an electrode, a soldering iron, or the like) to be connected to the surface of this member A; and a connection between the surface of this member A and a probe for resistance measurement or the like, when this member A is used as an electrode for resistance measurement.

Meanwhile, since the polymer remains on the member B preferentially (preferably, selectively), the member B is protected by the residual polymer. For example, in the case of providing a plasma treatment process or a wiring formation process, as the following process, diffusion of a plasma component or a metal component into the member B can be suppressed.

Further, by letting the polymer remain preferentially (preferably, selectively) on the member B, a patterned irregular face can be obtained.

The pH of the composition in the invention is preferably from 3.0 to 9.0, more preferably from 3.0 to 7.5, still more preferably from 3.0 to 7.0, yet more preferably from 3.0 to 6.5, and particularly preferably from 4.0 to 6.0.

Hereinafter, a composite member preparation process, a composition preparation process, and an application process in the invention are explained, and successively, other processes (a removal process, a cleaning process, and the like), which may be provided as needs arise, are explained.

<Composite Member Preparation Process>

The composite member preparation process in the invention is a process of preparing a composite member that includes a member A and a member B, a surface of the member B having an isoelectric point that is lower than an isoelectric point of a surface of the member A by 2.0 or more and the isoelectric point of the member B being from 1.0 to 7.5, and that satisfies a relationship: the isoelectric point of a surface of the member B<the pH of the composition<the isoelectric point of a surface of the member A.

In the manufacturing method of the invention, this composite member is an object, to which the composition is applied.

This preparation process is a process provided for convenience.

The preparation in the present process includes not only preparation of a composite member that is prepared in advance, prior to the application process, but also manufacture of a composite member, prior to the application process.

In the composite member, the isoelectric point in the surface of the member B is lower than the isoelectric point in the surface of the member A, and the difference between the two isoelectric points is 2.0 or more.

The difference between the two isoelectric points is preferably 3.0 or more, more preferably 4.0 or more, and particularly preferably 5.0 or more.

The isoelectric point in the surface of the member A is preferably from 5.0 to 12.0, and more preferably from 6.0 to 11.0.

The isoelectric point in the surface of the member B is preferably from 1.0 to 6.0, and more preferably from 1.5 to 4.0.

In the invention, the "isoelectric point" refers to a pH value of the solvent in which the zeta potential of a substrate surface in water, which is measured in accordance with an electromigration method, a streaming potential method, an electroosmosis method, or the like, becomes zero. Further, as examples of the isoelectric point of the surface of a solid, isoelectric points described in G. A. Parks, Chemical Reviews, vol. 65, pages 177 to 198 (1965) can be described.

As described above, the composite member satisfies the relationship: the isoelectric point of a surface of the member B<the pH of the composition<the isoelectric point of a surface of the member A.

From the viewpoint of more effectively exhibiting the effects of the invention, it is preferable that the composite member satisfies the relationship: the isoelectric point of a surface of the member B<the pH of the composition<{(the isoelectric point of a surface of the member A)−1.0}.

In the above relationship, particularly, when the relationship: the pH of the composition<{(the isoelectric point of a surface of the member A)−1.0} is satisfied, the polymer more hardly adheres to the member A, and thus, the polymer more hardly remains on the member A.

The composite member may have only one of member A, or may have plural thereof.

It is preferable that the member A contains at least one element (hereinafter, also referred to as a "specific metal element") selected from the group consisting of Cu, Al, Ti, Ni, Fe, Sn, Cr, Mn, Pt, Zn, and Mg.

In this case, the member A may contain a metal element other than the specific metal element or a non-metal element (for example, nitrogen (N), oxygen (O), or the like).

It is preferable that the member A contains the specific metal element as the main component.

Here, the "main component" indicates the component that is included at the highest content percentage (% by mass) (hereinafter the same applies).

The content percentage of the specific metal element in the member A is preferably 50% by mass or higher, preferably 80% by mass or higher, and preferably 90% by mass or higher.

The member A is not limited to have a form of a member capable of being present independently, and may have, for example, a form of a member provided on a substrate.

In a case in which the member A is a member provided on a substrate, this member A can be formed in accordance with a known means such as sputtering, vapor deposition, CVD (Chemical Vapor Deposition), metal plating, or ALD (Atomic Layer Deposition). In this case, examples of the form of the member A include a form being not subjected to patterning (a form of a so-called solid membrane), a form being subjected to patterning by etching or the like, and a form being embedded in a concave portion (a concave portion formed by etching or the like) of an insulating layer by metal plating or the like.

Examples of the member A in this case include conductive parts (for example, a wiring, an electrode, or the like).

The composite member may have only one of member B or may have plural thereof.

The member B preferably contains silica.

In this case, the member B may contain a component other than silica.

It is preferable that the member B contains silica as the main component.

The content percentage of silica in the member B is preferably 50% by mass or higher, preferably 80% by mass or higher, and preferably 90% by mass or higher.

The member B is not limited to have a form of an independent member, and may have, for example, a form of a member provided on a substrate (for example, a substrate).

In a case in which the member B is a member provided on a substrate, this member B can be formed in accordance with a known means such as sputtering, vapor deposition, CVD (Chemical Vapor Deposition), or coating of a composition. Examples of the form of this layer include a form being not subjected to patterning (a form of a so-called solid membrane), and a form being subjected to patterning by etching or the like (including a form in which a pattern-shaped concave portion or an opening is provided).

Examples of the member B in this case include insulating layers (including a low dielectric constant layer) and the like.

The member B may have at least one polar group, such as a silanol group, a carboxyl group, a hydroxyl group, or a sulfonic acid group.

It is preferable that the member B contains a porous material.

In such a form, the surface or interface of the porous material included in the member B can be covered by a polymer. Accordingly, for example, in a case in which an insulating layer is used as the member B, an increase in the dielectric constant and the like, which may be caused by the penetration of a metal component or a plasma component into the pores, can be further suppressed.

The porous material is preferably a porous silica.

More preferably, the member B contains a porous silica, and it is preferable that the member B has a silanol group derived from the porous silica on a surface thereof (the surface, to which the composition is to be applied). By the interaction between this silanol group and the cationic functional group contained in the polymer, the pore-covering property of the polymer is further enhanced.

The pore radius in the member B that contains a porous material is not particularly limited, but from the viewpoint of more effectively realizing the effect of the pore-covering property of the polymer included in the composition, the pore radius is preferably from 0.5 nm to 3.0 nm, and more preferably from 1.0 nm to 2.0 nm.

As the porous silica, for example, a porous silica which is commonly used in an interlayer insulating layer of a semiconductor device, or the like can be used. Examples thereof may include an oxide having uniform meso-pores which is obtained by utilizing self-organization of an organic compound and an inorganic compound, and which is obtained by hydrothermal synthesis in a sealed heat-resistant container, using silica gel, a surfactant, and the like, as described in WO 91/11390; and a porous silica produced from a condensate of an alkoxysilane and a surfactant, as described in Nature, vol. 379 (page 703), 1996, and Supramolecular Science, vol. 5 (page 247 and the like), 1998.

As the porous silica, it is also preferable to use a porous silica (for example, a porous silica that is formed using a composition including a specific siloxane compound) described in WO 2009/123104 and WO 2010/137711.

The layer containing the porous silica can be formed, for example, by coating a composition for forming the porous silica described above on a substrate, and then appropriately carrying out a heat treatment or the like.

In a preferable embodiment of the invention, the member A contains a Cu element, and the member B contains silica. In this embodiment, the pH of the composition is more preferably 6.5 or lower, from the point of view that the composition more hardly adheres to the surface of the member A.

The composite member in the invention is not particularly limited as far as the composite member includes member A and member B.

As a preferable form of the composite member, a form of a composite member having a substrate and, on this substrate, a conductive part as the member A and an insulating layer as the member B is described. The configuration of the composite member having this form is not particularly limited as far as it is a configuration in which at least a part of the surface of the conductive part and at least a part of the surface of the insulating layer are exposed, and it is possible to apply a composition to these exposed areas.

The conductive part is not particularly limited, but at least one of a wiring or an electrode is described.

The substrate is not particularly limited, and examples thereof may include a glass substrate, a quartz substrate, a semiconductor substrate (for example, a silicon wafer), a stainless steel substrate, and a plastic substrate. Further, the shape of the substrate is also not particularly limited, and may be any of a board-like shape, a dish-like shape, or the like.

Examples of the composite member having the above preferable form include a print wiring substrate, a semiconductor device (a semiconductor substrate provided with a wiring and an interlayer insulating layer), and a substrate for a display device (for example, a substrate for a liquid crystal display device or a substrate for an organic electroluminescence display device).

The volume resistivity (specific resistance) of the conductive part is not particularly limited and is, for example, in a range of less than $1 \times 10^7$ Ω·cm (preferably $1 \times 10^2$ Ω·cm or less, more preferably 10 Ω·cm or less, and particularly preferably 1 Ω·cm or less).

The volume resistivity (specific resistance) of the insulating layer is not particularly limited, and is, for example, in a range of $1 \times 10^7$ Ω·cm or more (preferably $1 \times 10^8$ Ω·cm or more, more preferably $1 \times 10^9$ Ω·cm or more, and particularly preferably $1 \times 10^{10}$ Ω·cm or more).

The dielectric constant of the insulating layer is not particularly limited. As the dielectric constant of the insulating layer in a print wiring substrate, a semiconductor device, or the like, a usual range is described, and, for example, the dielectric constant in a measurement frequency of from 100 kHz to 1 MHz is in a range of 12 or less (preferably 4 or less, and more preferably 3 or less).

Before the application of the composition (application process), among the surfaces of the member A in the composite member, at least the face onto which the composition is to be applied may be subjected to pretreatment.

The pretreatment is preferably carried out, using a chelating agent that forms a hydrophobic group on the surface of the member A, such as benzotriazole, phenanthroline, bipyridyl, 2,2'-bipyridine, 1,10-phenanthroline, tribipyridine, acetylacetone, triaminopropane, or 8-quinolinol, or an acid that forms a hydrophobic group on the surface of the member A, such as a saturated aliphatic monocarboxylic acid (propionic acid, butyric acid, valeric acid, hexanoic acid, heptanoic acid, octanoic acid, nonanoic acid, decanoic acid, lauric acid, tridecanoic acid, myristic acid, pentadecanoic acid, palmitic acid, heptadecanoic acid, stearic acid, or the like), an unsaturated aliphatic monocarboxylic acid (acrylic acid, α-linolenic acid, linoleic acid, oleic acid, or the like), an aromatic monocarboxylic acid (benzoic acid, salicylic acid, or the like), phthalic acid, or picolinic acid.

The pretreatment may be carried out by either a liquid phase method or a vapor phase method, and a commonly used method is used.

According to the pretreatment, only the surface of the member A can be made hydrophobic, and thus, the interaction between the surface of the member A and the composition is further reduced and, as a result, adhesion of the composition to the surface of the member A is further suppressed. Consequently, the selectivity in remaining the polymer on the member B can be further improved.

Next, specific examples of the composite member are explained with reference to the drawings; however, the invention is by no means limited to the following specific examples. In the drawings, with regard to a configuration that is not essential in the invention, illustration is omitted. Moreover, in the following, the same symbol is attached to the same member, and repeated explanation may be omitted.

FIG. 1 is a conceptual sectional diagram schematically showing a composite member according to the first specific example.

As shown in FIG. 1, the composite member according to the first specific example is configured to include, on a substrate 10, a first insulating layer 14, a second insulating layer 12 that is disposed on the lower side of the first insulating layer 14 (the side nearer to the substrate 10), and a wiring 20 (a conductive part that serves as the member A) that is embedded in the second insulating layer 12. The wiring 20 contains the specific metal element described above. Further, the first insulating layer 14 and the second insulating layer 12 (both are insulating layers that serve as the member B) contain silica.

In the first insulating layer 14, a concave portion 16 is formed in advance by etching such as dry etching or the like, and the wiring 20 is exposed on at least a part of the bottom face of the concave portion 16. Namely, at least a part of the bottom face of the concave portion 16 is constituted by an exposed face 20a of the wiring 20.

In the invention, in the case of using the composite member according to the first specific example, the composition is applied to the wall faces (the bottom face and the side faces) of the concave portion 16, the upper face of the first insulating layer 14 (the face on the side farther from the substrate), and the exposed face 20a of the wiring 20. Accordingly, a layer containing the polymer contained in the composition (hereinafter, also referred to as a "polymer layer") is formed on these areas.

In this process, as described above, since the pH of the composition is within a range of from 2.0 to 11.0, and the relationship: the isoelectric point of the surfaces of the respective insulating layers (member B)<the pH of the composition<the isoelectric point of the surface of the wiring 20 (member A) is satisfied, the exposed faces (including the wall faces of the concave portion) of the respective insulating layers are suitably covered with the polymer layer due to the action of the attractive force described above. Meanwhile, the polymer layer is also formed on the exposed face 20a of the wiring 20, however, due to the action of the repulsive force described above, this polymer is in the state of being less likely to remain on the exposed face 20a. Further, even if the polymer layer has remained on the exposed face 20a, by performing an ordinary removal process, at least a part of the polymer layer on the exposed face 20a can be removed easily, while remaining the polymer layer on the exposed faces of the respective insulating layers. Since the polymer layer remains on the exposed faces of the respective insulating layers, in the case of performing a plasma treatment in the succeeding step, diffusion of a plasma component into the respective insulating layers is suppressed.

In addition, since the polymer layer hardly remains on the exposed face 20a, (after removing at least a part of the polymer layer on the exposed face 20a, if necessary) when an additional wiring (for example, a wiring) is embedded in the concave portion, the electrical conductivity between the wiring 20 and the thus embedded wiring becomes favorable. Moreover, since the wall faces of the concave portion are covered with the polymer layer, the phenomenon, in which a metal component in the embedded wiring diffuses into the insulating layer, is suppressed.

The first specific example is by no means limited to the structure shown in FIG. 1.

For example, a barrier layer or the like may be formed on at least a part of the side face of the concave portion 16.

Further, other layer such as an etching stopper layer may exist between the first insulating layer 14 and the second insulating layer 12. Alternatively, the first insulating layer 14 and the second insulating layer 12 may be integrated to constitute one insulating layer.

The cross sectional shape of the concave portion 16 shown in FIG. 1 is a cross sectional shape having two types of depth (in the shape of stairs); however the cross sectional shape of the concave portion is not limited to this example. The cross sectional shape of the concave portion may be a cross sectional shape having only one type of depth (having a fixed depth), or may be a cross sectional shape having three or more types of depth. Further, in the insulating layer, in addition to the concave portion 16, other concave portion, in which the deepest portion thereof has a depth different from that of the concave portion 16, may be formed.

Moreover, a circuit of a transistor or the like may be formed between the substrate 10 and, the wiring 20 and the second insulating layer 12, if necessary.

As the first specific example above, a semiconductor substrate equipped with an interlayer insulating layer and a wiring (for example, a wiring containing copper) is described. In this case, the first insulating layer 14 and the second insulating layer 12 correspond to the interlayer insulating layer, and the wiring 20 corresponds to the wiring.

With regard to the configuration of the semiconductor substrate (semiconductor device) described above, the configuration of a semiconductor device described, for example, in WO 2009/153834 (especially, paragraphs 0040 to 0041, and FIG. 2E) can be referred to.

Figure 2:
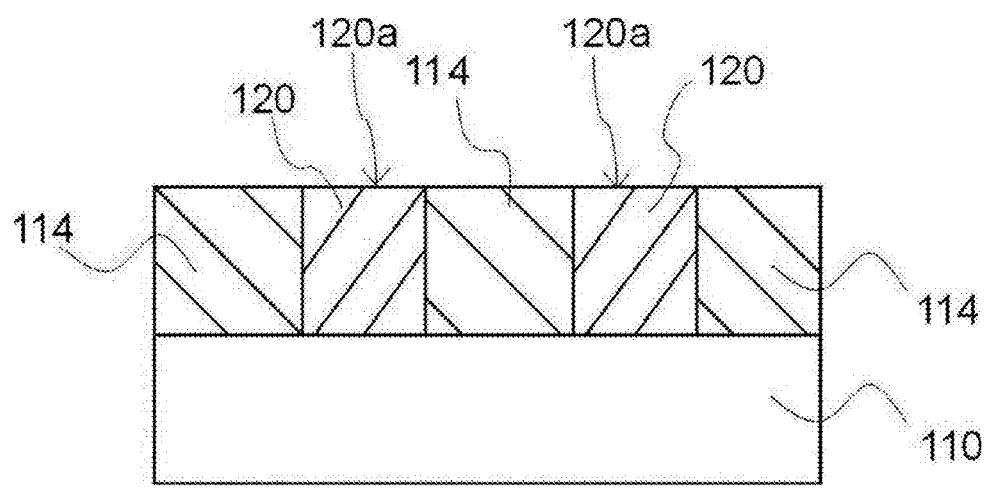
FIG. 2 is a conceptual sectional diagram schematically showing a cross section of a composite member, in another example of the manufacturing method according to the invention.

FIG. 2 is a conceptual sectional diagram schematically showing a composite member according to the second specific example.

As shown in FIG. 2, the composite member according to the second specific example is configured to include, on a substrate 110, an insulating layer 114 (an insulating layer that serves as the member B), and a conductive part 120 (a conductive part that serves as the member A) that is embedded in this insulating layer 114. The conductive part 120 contains the specific metal element described above. Further, the insulating layer 114 contains silica.

The upper face of the conductive part 120 is exposed (exposed face 120a).

In the invention, in the case of using the composite member according to the second specific example, the composition is applied to the upper face of the insulating layer 114 and the upper face (exposed face 120a) of the conductive part 120. Accordingly, a polymer layer is formed on these areas.

In this process, as described above, the exposed face of the insulating layer 114 is suitably covered with the polymer layer due to the action of the attractive force. Meanwhile, although the polymer layer is also formed on the exposed face 120a of the conductive part 120, due to the action of the repulsive force described above, this polymer is in the state of being less likely to remain on the exposed face 120a. Further, even if the polymer layer has remained on the exposed face 120a, by performing an ordinary removal method (cleaning, or the high temperature heat treatment described below, or the like), at least a part of the polymer layer on the exposed face 120a can be removed easily, while remaining the polymer layer on the exposed face of the insulating layer 114.

Accordingly, the same effect as that in the first specific example can be exhibited.

Particularly, since the polymer layer hardly remains on the exposed face 120a, (after removing at least a part of the polymer layer on the exposed face 120a, if necessary), in the case of forming an additional wiring on the exposed face 120a by film formation (sputtering or the like) or embedding (metal plating or the like), or in the case of using the exposed face 120a as a connection part with a soldering iron or the like, the electrical connection between the conductive part 120 and the additional wiring, the soldering iron, or the like is maintained favorable.

The conductive part 120 is preferable as a wiring or an electrode.

The second specific example is by no means limited to the structure shown in FIG. 2.

For example, the conductive part 120 and the insulating layer 114 are not limited to be directly formed on the substrate 110, and may be formed through an insulating film or the like.

Moreover, the composite member according to the second specific example may have a circuit of a transistor or the like, if necessary.

As the second specific example above, a print wiring substrate, a substrate for a display device, and the like are described.

As the composite member in the invention, other than the first specific example or the second specific example, a composite member which has a configuration in which the side wall of a wiring is exposed on a part of the wall face of a through-hole, such as a built-up wiring board, is also described.

<Composition Preparation Process>

The composition preparation process in the invention is a process of preparing a composition that contains a polymer having a cationic functional group and having a weight average molecular weight of from 2,000 to 1,000,000, and that has a pH of from 2.0 to 11.0.

This composition preparation process is a process provided for convenience.

The preparation in the present process includes not only preparation of a composition that is prepared in advance, prior to the application process, but also manufacture of a composition, prior to the application process.

The composition in the invention contains a polymer having a cationic functional group and having a weight average molecular weight of from 2,000 to 1,000,000, and has a pH of from 2.0 to 11.0. Here, the pH indicates the value measured at 25° C. The method for measuring the pH may be a method using a generally used pH meter or pH test paper. As an example, a pH meter is dipped in the composition, to measure the pH value. Here, the pH meter is used on the assumption that calibration has been made by using a pH standard liquid adjusted with a buffer solution.

In the present process, by applying this composition to the surface of the member A and the surface of the member B, a polymer layer containing the above polymer is formed on these surfaces.

(Polymer)

The polymer in the invention has at least one cationic functional group.

In the invention, due to the interaction between this cationic functional group and the surface of the member B, the persistent quality of the polymer with respect to the member B is improved.

It is preferable that the polymer has two or more cationic functional groups in one molecule. By having such a configuration, the polymer is multipoint adsorbed to the surface of the member B and, as a result, the persistent quality of the polymer layer with respect to the member B is further improved.

The cationic functional group is not particularly limited as far as the cationic functional group is a functional group capable of being positively charged. As the cationic functional group, a functional group containing a nitrogen atom (a primary nitrogen atom, a secondary nitrogen atom, a tertiary nitrogen atom, or a quaternary nitrogen atom) is preferable. The "functional group containing a nitrogen atom" used herein also includes a functional group that consists of only one nitrogen atom.

In the invention, the term "primary nitrogen atom" refers to a nitrogen atom bonded only to two hydrogen atoms and one other atom than a hydrogen atom (for example, the nitrogen atom contained in the primary amino group (—$NH_2$ group)), or a nitrogen atom (a cation) bonded only to three hydrogen atoms and one other atom than a hydrogen atom.

Further, the term "secondary nitrogen atom" refers to a nitrogen atom bonded only to one hydrogen atom and two other atoms than a hydrogen atom (for example, the nitrogen atom contained in the functional group represented by Formula (a) below), or a nitrogen atom (a cation) bonded only to two hydrogen atoms and two other atoms than a hydrogen atom.

Further, the term "tertiary nitrogen atom" refers to a nitrogen atom bonded only to three other atoms than a hydrogen atom (that is, the nitrogen atom of the functional group represented by Formula (b) below), or a nitrogen atom (a cation) bonded only to one hydrogen atom and three other atoms than a hydrogen atom.

Moreover, the term "quaternary nitrogen atom" refers to a nitrogen atom (a cation) bonded only to four other atoms than a hydrogen atom.

In the description above, the "other atom than a hydrogen atom" is not particularly limited, and may be, for example, a carbon atom, a silicon atom, or the like. A carbon atom is preferable.

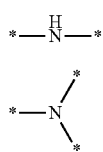

In Formula (a) and Formula (b), * represents a bond position with an atom other than a hydrogen atom.

Here, the functional group represented by Formula (a) above may be a functional group that constitutes a part of a secondary amino group (an —NHR$^a$ group; here, R$^a$ represents an alkyl group), or may be a divalent linking group contained in the skeleton of the polymer.

Further, the functional group (that is, a tertiary nitrogen atom) represented by Formula (b) above may be a functional group that constitutes a part of a tertiary amino group (an —NR$^b$R$^c$ group; here, each of R$^b$ and R$^c$ independently represents an alkyl group), or may be a trivalent linking group contained in the skeleton of the polymer.

The weight average molecular weight of the polymer in the invention is from 2,000 to 1,000,000.

The weight average molecular weight being 2,000 or more is advantageous in terms of adsorptivity of the polymer with respect to the member B. Particularly, when the polymer has two or more cationic functional groups, the polymer is easily multipoint adsorbed to the member B.

The weight average molecular weight being 1,000,000 or less is also advantageous in terms of the covering property of the polymer with respect to the member B. Particularly, when the member B has a concave portion, an opening, or the like, the polymer easily enters the concave portion, the opening, or the like, and the covering property of the polymer with respect to the wall surfaces of the concave portion or the opening is improved.

The weight average molecular weight of the polymer in the invention is preferably from 2,000 to 600,000, more preferably from 10,000 to 200,000, still more preferably from 20,000 to 200,000, and yet more preferably from 20,000 to 150,000.

Note that, the weight average molecular weight and the molecular weight distribution in the invention indicate the weight average molecular weight and molecular weight distribution in terms of polyethylene glycol standard, which are measured in accordance with the GPC (Gel Permeation Chromatography) method.

Specifically, the weight average molecular weight and the molecular weight distribution in the invention are measured using, as the eluent, an aqueous solution having an acetic acid concentration of 0.5 mol/L and a sodium nitrate concentration of 0.1 mol/L, and using an analyzer SHODEX GPC-101 and a column ASAHIPAK GF-7M HQ, and are calculated using polyethylene glycol as a reference standard.

From the viewpoint of further improving the persistent quality of the polymer with respect to the surface of the member B, it is preferable that the polymer has a high cation density. Specifically, the cationic functional group equivalent weight is preferably from 27 to 430, and more preferably from 43 to 200.

Here, the term "cationic functional group equivalent weight" means a weight average molecular weight per cationic functional group, and is a value (Mw/n) obtained by dividing the weight average molecular weight (Mw) of a polymer by the number (n) of the cationic functional groups contained in the polymer corresponding to one molecule. The larger the cationic functional group equivalent weight is, the lower the cationic functional group density is. Further, the smaller the cationic functional group equivalent weight is, the higher the cationic functional group density is.

The polymer may further have an anionic functional group or a nonionic functional group, if necessary.

The nonionic functional group may be a hydrogen bond-accepting group or may be a hydrogen bond-donating group. Examples of the nonionic functional group may include a hydroxyl group, a carbonyl group, and an ether group (—O—).

The anionic functional group is not particularly limited as far as the anionic functional group is a functional group capable of being negatively charged. Examples of the anionic functional group may include a carboxyl group, a sulfonic acid group, and a sulfuric acid group.

Specific examples of the polymer in the invention may include polyalkyleneimine (for example, a polyalkyleneimine that is a polymer of an alkyleneimine having from 2 to 12 carbon atoms (preferably from 2 to 8 carbon atoms, and more preferably from 2 to 4 carbon atoms); particularly preferably polyethyleneimine (PEI)), polyallylamine (PAA), polydiallyl dimethyl ammonium (PDDA), polyvinyl pyridine (PVP), polylysine, polymethyl pyridyl vinyl (PMPyV), protonated poly(p-pyridyl vinylene) (R-PHPyV), and any derivatives thereof.

Among them, polyalkyleneimine (for example, a polyalkyleneimine that is a polymer of an alkyleneimine having from 2 to 12 carbon atoms (preferably from 2 to 8 carbon atoms, and more preferably from 2 to 4 carbon atoms); particularly preferably polyethyleneimine (PEI) or a derivative thereof, polyallylamine (PAA), and the like are preferable, and polyalkyleneimine (for example, a polyalkyleneimine that is a polymer of an alkyleneimine having from 2 to 12 carbon atoms (preferably from 2 to 8 carbon atoms, and more preferably from 2 to 4 carbon atoms); particularly preferably polyethyleneimine (PEI)) or a derivative thereof is more preferable.

Polyethyleneimine (PEI) can be produced by a known method described in Japanese Patent Application Publication (JP-B) No. S43-8828, JP-B No. S49-33120, Japanese Patent Application Laid-Open (JP-A) No. 2001-2123958, WO 2010/137711, and the like. A polyalkyleneimine other than polyethyleneimine can also be produced by a method similar to the method of producing polyethyleneimine.

It is also preferable that the polymer in the invention is a derivative of the polyalkyleneimine described above (a polyalkyleneimine derivative; particularly preferably, a polyethyleneimine derivative). The polyalkyleneimine derivative is not particularly limited as far as the polyalkyleneimine derivative is a compound that can be produced by using the above polyalkyleneimine. Specific examples thereof may include a polyalkyleneimine derivative obtained by introducing an alkyl group (preferably an alkyl group having from 1 to 10 carbon atoms) or an aryl group into a polyalkyleneimine, and a polyalkyleneimine derivative obtained by introducing a crosslinking group, such as a hydroxyl group, into a polyalkyleneimine.

These polyalkyleneimine derivatives can be produced by a commonly used method using the above polyalkyleneimine. Specifically, these polyalkyleneimine derivatives can be produced in accordance with the method described in, for example, JP-A No. H6-016809 and the like.

Further, as the polyalkyleneimine derivative, a highly branched polyalkyleneimine obtained by increasing the branching degree of a polyalkyleneimine, through reacting a cationic functional group-containing monomer with the polyalkyleneimine, is also preferable.

Examples of the method for obtaining the highly branched polyalkyleneimine include a method of reacting a cationic functional group-containing monomer with a polyalkyleneimine having plural secondary nitrogen atoms in the skeleton, thereby substituting at least some of the plural secondary nitrogen atoms with the cationic functional group-containing monomer; and a method of reacting a cationic functional group-containing monomer with a polyalkyleneimine having plural primary nitrogen atoms at the terminals, thereby substituting at least some of the plural primary nitrogen atoms with the cationic functional group-containing monomer.

Examples of the cationic functional group which may be introduced, in order to enhance the branching degree, may include an aminoethyl group, an aminopropyl group, a diaminopropyl group, an aminobutyl group, a diaminobutyl group, and a triaminobutyl group. From the viewpoint of decreasing the cationic functional group equivalent weight and increasing the cationic functional group density, an aminoethyl group is preferable.

As the method for obtaining a highly branched polyalkyleneimine, for example, the method explained in the section "Method of Producing Polymer" described below can be used.

The above polyethyleneimine and derivatives thereof may be commercially available products. For example, those selected as appropriate from polyethyleneimines and derivatives thereof available from NIPPON SHOKUBAI CO., LTD., BASF, and the like may be used.

It is preferable that the branching degree of the polymer in the invention is 48% or more.

When the branching degree is 48% or more, the member B can be suitably protected by the polymer layer containing this polymer. For example, in the case of performing a plasma treatment or formation of wiring after the application process, diffusion of a plasma component or a metal component into the member B can be suppressed more effectively. The reason why such an effect can be obtained is guessed as follows. Namely, it is guessed that the molecular chains of the polymer having a branched structure are intertwined each other, so that the distance between the molecular chains is reduced, and thus, a metal component, a plasma component, or the like can be efficiently prevented from penetrating between the molecular chains.

Such an effect is more effectively exhibited, when the member B contains a porous material.

Here, the "branching degree" refers to a value determined according to the following Equation 1.

$$\text{Branching degree (\%)} = \frac{(\text{number of tertiary nitrogen atoms} + \text{number of quaternary nitrogen atoms})}{(\text{number of secondary nitrogen atoms} + \text{number of tertiary nitrogen atoms} + \text{number of quaternary nitrogen atoms})} \times 100 \quad \text{Equation 1}$$

Accordingly, for example, in a case in which the polymer according to the invention is a polyalkyleneimine, a straight chain polyalkyleneimine is a polyalkyleneimine having a branching degree of 0%, since the straight chain polyalkyleneimine does not have any tertiary nitrogen atom or quaternary nitrogen atom; and a polyalkyleneimine in which all the nitrogen atoms contained in the skeleton portion except the terminals are tertiary nitrogen atoms (that is, being maximally branched) is a polyalkyleneimine having a branching degree of 100%.

The branching degree is preferably 55% or more, more preferably 70% or more, and particularly preferably 75% or more.

The upper limit of the branching degree of the polymer is not particularly limited; and in a case in which the polymer contains a secondary nitrogen atom, the branching degree is less than 100%. From the viewpoint of the easiness of synthesis, it is preferable that the branching degree of the polymer is 95% or less.

There is no particular limitation as to the method of adjusting the branching degree of the polymer to 48% or more. Examples of the method include a method of adjusting the branching degree by the monomer polymerization condition itself in the synthesis of a polymer, and a method of increasing the branching degree by reacting another nitrogen-containing compound or an alkyl compound with respect to the primary nitrogen atom or the secondary nitrogen atom contained in the polymer, to generate a tertiary nitrogen atom or a quaternary nitrogen atom from the primary nitrogen atom or the secondary nitrogen atom. Specific examples of the latter method are described below as a "method of producing a polymer".

More preferably, the polymer has two or more cationic functional groups including at least one of a tertiary nitrogen atom or a quaternary nitrogen atom.

Here, the "polymer having two or more cationic functional groups including at least one of a tertiary nitrogen atom or a quaternary nitrogen atom" means a polymer having two or more cationic functional groups that include at least one of a tertiary nitrogen atom or a quaternary nitrogen atom as the cationic functional group (that is, a polymer having two or more cationic functional groups, in which at least one of the two or more cationic functional groups is at least one of a tertiary nitrogen atom or a quaternary nitrogen atom).

The polymer is preferably a polymer having, as the cationic functional groups, two or more of at least one of a tertiary nitrogen atom or a quaternary nitrogen atom (particularly preferably, a tertiary nitrogen atom).

The polymer may contain a primary nitrogen atom or a secondary nitrogen atom, as the cationic functional group.

In a case in which the polymer according to the invention contains one or more primary nitrogen atoms, the proportion of the amount of primary nitrogen atom to the total amount of the nitrogen atoms in the polymer is preferably 33% by mole or higher. When the polymer contains one or more primary nitrogen atoms (particularly, when the proportion of the amount of primary nitrogen atom is 33% by mole or higher), the wettability of the polymer with respect to the member B is further improved, and the uniformity of the thickness of the polymer layer is further improved.

Further, in a case in which the polymer contains one or more primary nitrogen atoms, it is preferable that a nitrogen atom other than a primary nitrogen atom, such as a secondary nitrogen atom, coexists with the primary nitrogen atom. Herewith, the thickness of the polymer layer is easily adjusted to an appropriate range.

Further, it is preferable that the polymer in the invention has a structural unit having a cationic functional group (hereinafter, may be referred to as a "specific structural unit").

In this case, the cationic functional group may be contained in the specific structural unit as at least a part of the main chain, or may be contained as at least a part of a side chain, or may be contained as at least a part of the main chain and at least a part of a side chain.

In a case in which the specific structural unit contains two or more cationic functional groups, the two or more cationic functional groups may be the same as or different from each other.

Further, in a case in which the member B has the polar group described above, it is preferable that the cationic functional group is contained such that the ratio (hereinafter, may be referred to as "relative distance between the cationic functional groups") of the length of the main chain of the specific structural unit relative to the average distance between the adsorption points (polar groups) of the cationic functional groups present on the member B is 1.6 or less, and more preferably from 0.08 to 1.0. In such an embodiment, the polymer can be more efficiently multipoint adsorbed to the member B.

The molecular weight of the specific structural unit is preferably from 30 to 500, and more preferably from 40 to 200, from the viewpoint of the adsorptivity to the interlayer insulating layer. Here, the molecular weight of the specific structural unit means the molecular weight of a monomer that constitutes the specific structural unit.

The specific structural unit preferably has a relative distance between the cationic functional groups of 1.6 or less and a molecular weight of from 30 to 500, and more preferably has a relative distance between the cationic functional groups of from 0.08 to 1.0 and a molecular weight of from 40 to 200, from the viewpoint of the adsorptivity to the interlayer insulating layer.

Specific examples of the specific structural unit (structural unit having a cationic functional group) include unit structures derived from a cationic functional group-containing monomer exemplified below.

Specific examples of the cationic functional group-containing monomer include alkyleneimine, allylamine, diallyl dimethyl ammonium salt, vinylpyridine, lysine, methyl vinylpyridine, and p-vinylpyridine.

The alkyleneimine is preferably an alkyleneimine having from 2 to 12 carbon atoms, and more preferably an alkyleneimine having from 2 to 8 carbon atoms. An alkyleneimine having from 2 to 4 carbon atoms is particularly preferable.

Further, the alkyleneimine is preferably a substituted or unsubstituted cyclic amine.

Specific examples of the alkyleneimine include ethyleneimine (another name: aziridine), propyleneimine (another name: 2-methylaziridine), butyleneimine, pentyleneimine, hexyleneimine, heptyleneimine, octyleneimine, trimethyleneimine (another name: azetidine), tetramethyleneimine (another name: pyrrolidine), pentamethyleneimine (another name: piperidine), hexamethyleneimine, and octamethyleneimine. Among them, ethyleneimine is particularly preferable.

As the cationic functional group-containing monomer, among the monomers described above, at least one of an alkyleneimine (preferably, an alkyleneimine having from 2 to 8 carbon atoms) or an allylamine is preferable, and an alkyleneimine (preferably, an alkyleneimine having from 2 to 4 carbon atoms, and particularly preferably, ethyleneimine) is more preferable, from the viewpoint of the adsorptivity to the member B.

Further, it is preferable that the polymer in the invention contains a structural unit that is derived from an alkyleneimine having from 2 to 8 carbon atoms (more preferably from 2 to 4 carbon atoms) and that contains a tertiary nitrogen atom, as the specific structural unit (structural unit having a cationic functional group), from the viewpoint of the adsorptivity to the member B.

From the viewpoint of easiness of synthesis, it is more preferable that the polymer in the invention includes a structural unit that is derived from an alkyleneimine having from 2 to 8 carbon atoms (more preferably from 2 to 4 carbon atoms) and that contains a secondary nitrogen atom, in addition to the "structural unit that is derived from an alkyleneimine having from 2 to 8 carbon atoms (more preferably from 2 to 4 carbon atoms) and that contains a tertiary nitrogen atom".

Moreover, in the case of introducing a cationic functional group by reacting at least one of the primary nitrogen atom or the secondary nitrogen atom contained in the polymer with a nitrogen-containing compound, in order to increase the branching degree, examples of the cationic functional group to be introduced into the polymer may include the cationic functional groups shown below ("*" represents a bond position with a nitrogen atom in the polymer skeleton), and an aminopropyl group, a diaminopropyl group, an aminobutyl group, a diaminobutyl group, and a triaminobutyl group.

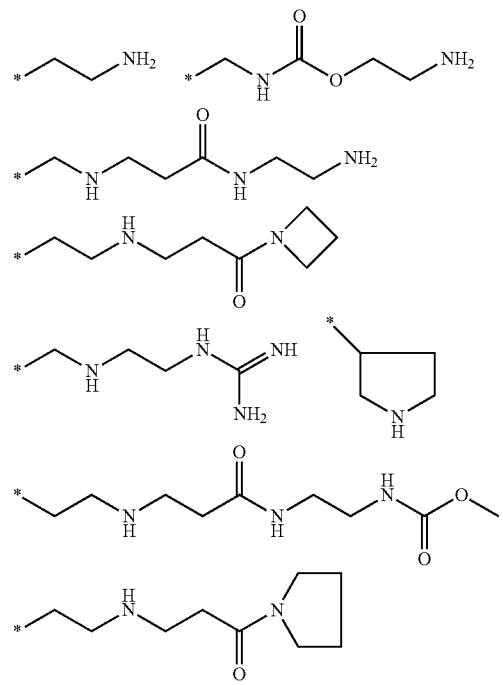

Among the cationic functional groups to be introduced into the polymer, an aminoethyl group is preferable, from the viewpoint of decreasing the cationic functional group equivalent weight and increasing the cationic functional group density.

In a case in which the polymer in the invention contains two or more of specific structural units, the respective structural units may be different from each other in terms of any of the kind or number of the cationic functional groups contained, the molecular weight, or the like. The two or more of specific structural units may be incorporated as a block copolymer, or may be incorporated as a random copolymer.

Further, the polymer may further contain at least one structural unit (hereinafter, may be referred to as "second structural unit") other than the specific structural unit. In a case in which the polymer contains a second structural unit, the polymer may be a block copolymer including the specific structural unit and the second structural unit, or may be a random copolymer including the specific structural unit and the second structural unit.

The second structural unit is not particularly limited as far as the second structural unit is a structural unit derived from a monomer that can undergo polymerization with a monomer that constitutes the specific structural unit. Examples thereof may include a structural unit derived from an olefin, and the like.

Moreover, in a case in which the polymer in the invention does not have a particular structural unit but has a random structure formed by branchingly polymerizing a monomer that constitutes the polymer, the cationic functional group may be contained as at least a part of the main chain, or may be contained as at least a part of a side chain, or may be contained as at least a part of the main chain and at least a part of a side chain.

The polymer in the invention is also preferably a polymer that has a critical micelle concentration in an aqueous medium of 1% by mass or more, or a polymer that does not substantially form a micelle structure. Here, the expression "does not substantially form a micelle structure" refers to that a micelle is not formed under an ordinary condition such as in an aqueous medium at an ordinary temperature, that is, the critical micelle concentration cannot be measured. Since the polymer has such a feature, a thin polymer layer having a thickness of molecular level (for example, 5 inn or less) can be formed more effectively.

In the invention, the content of the polymer in the composition is not particularly limited, and the content can be set, for example, from 0.01% by mass to 5.0% by mass, and is preferably from 0.02% by mass to 0.3% by mass.

(Method of Producing Polymer)

As the method of producing a polymer having a branching degree of 48% or more, which is a preferable form of the polymer, for example, a production method including a process of reacting a raw material polymer containing at least one of a primary nitrogen atom or a secondary nitrogen atom with a monomer having a cationic functional group is preferable.

By the above reaction, at least one of a tertiary nitrogen atom or a quaternary nitrogen atom can be generated from at least one of the primary nitrogen atom or the secondary nitrogen atom contained in the raw material polymer, and thus, a polymer having a branching degree of 48% or more can be suitably obtained.

The above reaction can be conducted by mixing the raw material polymer and the monomer having a cationic functional group in a solvent such as water or an alcohol, and heating the mixture under reflux.

The reaction time can be adjusted as appropriate and is, for example, preferably from 1 hour to 24 hours, and more preferably from 2 hours to 12 hours.

The raw material polymer in the method described above is not particularly limited as far as the raw material polymer contains at least one of a primary nitrogen atom or a secondary nitrogen atom, and a raw material polymer containing a secondary nitrogen atom is preferable.

Examples of the raw material polymer containing a secondary nitrogen atom include a polyalkyleneimine that is a polymer of an alkyleneimine having from 2 to 12 carbon atoms (preferably from 2 to 8 carbon atoms), poly(N-alkylamide), and any derivatives thereof. Here, specific examples of the alkyleneimine having from 2 to 12 carbon atoms are as described above. In addition, examples of the derivatives include a polyalkyleneimine, into which an anionic functional group has been introduced, and the like.

The weight average molecular weight of the raw material polymer is not particularly limited as far as the weight average molecular weight enables production of the polymer having a weight average molecular weight of from 2,000 to 1,000,000 by the reaction with a monomer having a cationic functional group.

For example, the weight average molecular weight of the raw material polymer is preferably from 1,000 to 500,000, more preferably from 2,000 to 200,000, and particularly preferably from 5,000 to 150,000.

Examples of the monomer having a cationic functional group, which may be used in the above production method, include nitrogen-containing compounds.

Further, it is preferable that the cationic functional group in the monomer having a cationic functional group, which is used in the above production method, is bonded to a protective group that is stable under the reaction condition.

By having such a configuration, the reaction between the cationic functional group monomers can be suppressed, and thus a polymer having a higher branching degree can be produced.

As the protective group, a generally used protective group can be used.

Examples of the protective group include a t-butoxycarbonyl group (a Boc group), a benzyloxycarbonyl group, a methoxycarbonyl group, a fluorenylcarbonyl group, a formyl group, an acetyl group, a benzoyl group, a phthaloyl group, an allyl group, and a benzyl group.

The monomer having a cationic functional group bonded to a protective group is more preferably a nitrogen-containing compound having a nitrogen atom which is bonded to a protective group.

Specific examples of the nitrogen-containing compound having a nitrogen atom which is bonded to a protective group include compounds represented by any one of the following Formulae (m-1) to (m-3).

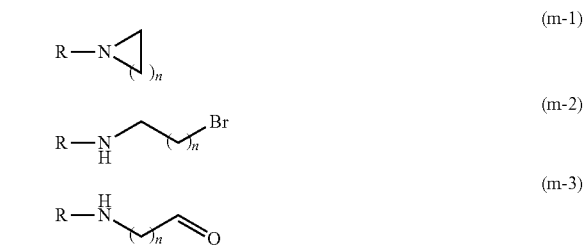

In Formulae (m-1) to (m-3) above, R represents a protective group, and n represents an integer from 1 to 4.

The protective group represented by R may be any functional group that is generally used as the protective group for a nitrogen atom and, for example, a t-butoxycarbonyl group (a Boc group), a benzyloxycarbonyl group, a methoxycarbonyl group, a fluorenylcarbonyl group, a formyl group, an acetyl group, a benzoyl group, a phthaloyl group, an allyl group, or a benzyl group is preferable.

The nitrogen-containing compound (monomer) having a nitrogen atom which is bonded to a protective group is more preferably a compound represented by Formula (m-1)

above, and particularly preferably a compound (protected aziridine) represented by Formula (m-1) above, in which n represents 1.

The method of producing the polymer according to the invention is particularly preferably a production method including a process of reacting a raw material polymer containing a secondary nitrogen atom (for example, a polyalkyleneimine that is a polymer of an alkyleneimine having from 2 to 12 carbon atoms) with a compound represented by Formula (m-1) above.

The method of producing a polymer may include other process, such as a process of deprotecting the cationic functional group having a protective group, which has been introduced into the polymer, if necessary.

(Acid)

The composition in the invention preferably contains at least one kind of acid.

This form is suitable in the case of adjusting the pH of the composition in the invention to the acidic side. The preferable range of the pH of the composition is as described above.

The acid is not particularly limited, and examples of the acid include a monocarboxylic acid compound, a dicarboxylic acid compound, and an oxydicarboxylic acid compound.

Examples of the monocarboxylic acid compound include aliphatic monocarboxylic acid compounds (for example, formic acid, acetic acid, propionic acid, butyric acid, methoxyacetic acid, ethoxyacetic acid, lactic acid, glycolic acid, glyceric acid, and the like) and aromatic monocarboxylic acid compounds (for example, benzoic acid, picolinic acid, salicylic acid, 3,4,5-trihydroxybenzoic acid, and the like).

Among the above compounds, monocarboxylic acid compounds are preferable, and aliphatic monocarboxylic acid compounds are more preferable, and formic acid and acetic acid are particularly preferable, from the viewpoint of achieving both the difficulty of remaining the polymer on the member A and the ease of remaining the polymer on the member B.

As the monocarboxylic acid compound, a monocarboxylic acid compound (hereinafter, may also referred to as "specific monocarboxylic acid compound"), that does not have a hydroxyl group or an amino group, and that has a van der Waals volume of 40 cm$^3$/mol or more is also preferable.

Inclusion of a specific monocarboxylic acid compound in the composition is advantageous in that it becomes hard for the polymer in the composition to adhere to the surface of the member A, in the application process of applying the composition containing the polymer to the surface of the member A. The reason for this is not clear, but is guessed as follows. Namely, a specific monocarboxylic acid compound having a van der Waals volume of 40 cm$^3$/mol or more includes a bulky hydrophobic group and one carboxyl group. It is thought that, when a composition containing the specific monocarboxylic acid compound and the polymer is applied to the surface of the member A (for example, copper), the carboxyl group of the specific monocarboxylic acid compound reacts with the surface of the member A, and thus the surface of the member A is covered with the bulky hydrophobic group and, as a result, the surface of the member A is hydrophobilized. Here, it is thought that, since the hydrophobic group that covers the surface of the member A is bulky, the surface of the member A is more strongly hydrophobilized (that is, the surface energy is lowered). Moreover, it is thought that, since the specific monocarboxylic acid does not have a hydroxyl group or an amino group, the surface of the member A is more hydrophobically maintained. For these reasons, it is thought that the adhesion of polymer to the surface of the member A is more effectively inhibited, and thus, the polymer in the composition hardly adheres to the surface of the member A.

Regarding the case in which the composition contains the specific monocarboxylic acid compound, for example, when explained using FIG. 1, in this case, it is advantageous in that a polymer layer is hardly formed on the exposed face 20a in the process of applying the composition to the exposed face 20a.

Accordingly, for example, it is possible to omit the process of removing the polymer layer on the exposed face 20a. For example, even in a case in which the process of removing the polymer layer is omitted, a state, in which the polymer layer is formed on the exposed faces of the respective insulating layers, but the exposed face 20a is not covered with the polymer layer, can be provided.

For the numerical value of the van der Waals volume of the specific monocarboxylic acid compound, the value described in "CHEMICAL PROPERTIES HANDBOOK" (edited by YAWS, published by McGraw Hill) is used.

It is more preferable that the van der Waals volume of the specific monocarboxylic acid compound is from 40 cm$^3$/mol to 85 cm$^3$/mol.

As the specific monocarboxylic acid compound (the monocarboxylic acid compound that does not have either a hydroxyl group or an amino group, and has a van der Waals volume of 40 cm$^3$/mol or more), specifically, propionic acid, picolinic acid, butyric acid, valeric acid, hexanoic acid, heptanoic acid, acrylic acid, and the like are preferable. Particularly, propionic acid and picolinic acid are preferable.

Moreover, in a case in which the surface of the member A, to which the composition is to be applied, is subjected to the pretreatment described above (pretreatment using, for example, benzotriazole, phenanthroline, bipyridyl, or the like), before the application of the composition to the surface of the member A, even when the specific monocarboxylic acid compound is not used but formic acid or acetic acid is used, it is possible to make the polymer hardly adhere to the surface of the member A in the application process of applying the composition to the surface of the member A.

The composition in the invention may further contain a hydrophobilizing agent.

As the hydrophobilizing agent, those commonly used may be used, and a chelating agent that forms a hydrophobic group on the surface of the member A, such as 8-quinolinol, benzotriazole, phenanthroline, bipyridyl, 2,2'-bipyridine, 1,10-phenanthroline, tribipyridine, acetylacetone, triaminopropane, tribipyridine, or phthalic acid, and the like are preferable.

It is preferable that a content of sodium and a content of potassium in the composition in the invention are each 10 ppb by mass or less, on an elemental basis. Herewith, deterioration in electric properties (for example, in a case in which the composite body includes a transistor, operation failure of transistor or the like), in the case of using an electronic device as the composite body, can be suppressed.

A particularly preferable form of the composition in the invention is a form of a composition that contains a polymer having a cationic functional group and having a weight average molecular weight of from 2,000 to 1,000,000 and a branching degree of 48% or more, and that has a pH of from 2.0 to 11.0, in which a content of sodium and a content of potassium in the composition are each 10 ppb by mass or less, on an elemental basis.

In this form, it is more preferable that the composition further contains a monocarboxylic acid compound.

In this form, a preferable range of the pH is as described above.

Further, in the case of using the composition in the invention as a semiconductor sealing composition, this form is particularly preferable.

Moreover, the composition in the invention is preferable not only for a semiconductor sealing composition, but also for a sealing composition in various electronic devices (a print wiring substrate, a display device, and the like).

The composition in the invention can contain a solvent, in addition to the polymer, if necessary.

The solvent is not particularly limited as far as the solvent is a solvent that uniformly dissolves the polymer and hardly forms a micelle. Examples of such a solvent may include water (preferably, ultrapure water) and water-soluble organic solvents (for example, alcohols and the like). In the invention, from the viewpoint of micelle forming property, it is preferable to use water or a mixture of water and a water-soluble organic solvent, as the solvent. Further, the boiling point of the solvent is not particularly limited, but is preferably 210° C. or lower and more preferably 160° C. or lower. When the boiling point of the solvent is within the above range, the solvent can be easily removed at a low temperature.

With regard to the components of the composition, the components of a composition described, for example, in WO 2010/137711 and WO 2012/033172, can be referred to, as appropriate.

The composition in the invention preferably has an average particle diameter measured by a dynamic light scattering method of 150 nm or less.

When the average particle diameter is 150 nm or less, the covering property of the polymer layer with respect to the member B is further enhanced. For example, even in a case in which a concave portion, an opening, or the like is formed in the member B, the wall faces of the concave portion, the opening, or the like can be suitably covered with the polymer layer.

Here, the average particle diameter is measured by a dynamic light scattering method using an ELSZ-2, manufactured by Otsuka Electronics Co., Ltd., and is obtained as a cumulant average particle diameter. Regarding the measurement conditions, measurement is conducted under the conditions of, for example, a cumulated number of 70 times, a repeat count of 3 times, in a solution concentration of from 0.1% to 1.0% and a temperature of from 23° C. to 26° C. A stable measurement can be carried out, by adding an electrolyte such as NaCl, if necessary.

Note that, the case in which the above average particle diameter in the composition is more than 150 nm is specifically a case in which a micelle (a micelle having an average particle diameter of more than 150 nm) is formed in the composition, a case in which polishing grains of a metal oxide or the like that are used at the time of polishing (chemical mechanical polishing) the wiring are included in the composition, or the like.

The above average particle diameter is more preferably 100 nm or less, still more preferably 50 nm or less, yet more preferably 30 nm or less, and particularly preferably 10 nm or less.

<Application Process>

The application process in the invention is a process of applying the above-described composition in the invention to the surface (exposed face) of the member A and the surface (exposed face) of the member B included in the composite member.

(Method of Applying Composition)

In the application process in the invention, the method of applying the composition is not particularly limited, and a commonly used method can be used.

Examples of a commonly used method include a dipping method (see, for example, U.S. Pat. No. 5,208,111), a spraying method (see, for example, Schlenoff et al., Langmuir, 16 (26), 9968, 2000 or Izuquierdo et al., Langmuir, 21 (16), 7558, 2005), and a spin coating method (see, for example, Lee et al., Langmuir, 19 (18), 7592, 2003 or J. Polymer Science, part B, polymer physics, 42, 3654, 2004).

There is no particular limitation as to the method of applying the composition in accordance with a spin coating method. For example, a method can be used, in which, while rotating the substrate equipped with a member A and a member B by using a spin coater, the composition is added dropwise onto the substrate at the side where the respective members are formed, then a rinsing liquid such as water is added thereto dropwise, to perform a rinsing treatment, and then the rotating speed of the substrate is raised to perform drying. In this process, drying may be carried out after repeating several times the dropwise addition of the composition and the dropwise addition of water. Further, the following operation may be performed. Namely, after the dropwise addition of the composition, the rotating speed is raised to perform drying, and after drying, the resulting substrate is once moved to a heat treatment equipment such as a hot plate, to perform a heat treatment, and after the heat treatment, the resulting substrate is moved back to the spin coater, followed by performing a rinsing treatment and drying (the above operation may be repeated several times).

The heat treatment in this case may be a heat treatment (a heat treatment under the condition of a temperature of from 70° C. to 125° C.) in the heating process described below.

In the method of applying the composition in accordance with a spin coating method, there is no limitation on various conditions such as the rotating speed of the substrate, the amount of the composition added dropwise, the time of adding dropwise the composition, the rotating speed of the substrate at the time of drying, the amount of the rinsing liquid added dropwise, or the time of adding dropwise the rinsing liquid, and the conditions can be adjusted as appropriate, while taking into account the thickness of the polymer layer to be formed or the like.

In the application process, by applying the composition to the member A and the member B (and further, if necessary, by appropriately drying the same by a commonly used method), a layer (polymer layer) that contains the above polymer is formed on the member A and the member B. After the application of the composition, the polymer may be crosslinked and polymerized.

The thickness of the polymer layer is not particularly limited, and the thickness is, for example, from 0.3 nm to 5 nm, and preferably from 0.5 nm to 2 nm.

In a case in which the member B includes a porous material, the polymer layer includes not only a form of a layer that is constituted only of the polymer, but also a form of a layer (a so-called penetrated layer) that has a configuration in which the polymer is penetrated into the pores of the porous material.

<Heating Process>

It is preferable that the manufacturing method of the invention further includes a heating process of heating the composite member to which the composition has been applied, under the condition of a temperature of from 70° C. to 125° C. Hereinafter, this heating process may be referred to as "soft bake (process)". Here, the temperature above indicates the temperature of the face of the composite member, to which the composition has been applied.

By having this heating process, both the difficulty of remaining the polymer on the member A and the ease of remaining the polymer on the member B can be achieved more effectively.

Specifically, when the temperature is 70° C. or higher, the persistent quality of the polymer applied to the member B is maintained favorable. Further, when the temperature is 125° C. or lower, it is possible to make the polymer more hardly remain on the member A.

The temperature is more preferably from 80° C. to 120° C., more preferably from 85° C. to 120° C., still more preferably from 90° C. to 115° C., and particularly preferably from 90° C. to 110° C.

Heating in the present process can be carried out by an ordinary method, and can be carried out using, for example, an oven or a hot plate.

The atmosphere for carrying out heating in the present process is not particularly limited and, for example, heating may be carried out under an air atmosphere, or may be carried out under an inert gas (nitrogen gas, argon gas, helium gas, or the like) atmosphere.

The heating time is not particularly limited, but is preferably 300 seconds or less, more preferably 200 seconds or less, still more preferably 120 seconds or less, and particularly preferably 80 seconds or less.

The lower limit of the heating time is not particularly limited, but the lower limit can be, for example, 10 seconds (preferably 20 seconds, and more preferably 30 seconds).

<Cleaning Process>

It is preferable that the manufacturing method of the invention further includes a cleaning process of cleaning the composite member to which the composition has been applied, with a rinsing liquid at a temperature of from 15° C. to 100° C.

By having this cleaning process, the removability of the polymer (polymer layer) from the member A is further improved. The expression "the removability is further improved" used herein includes that at least a part of the polymer can be removed by this cleaning operation itself, and also that at least a part of the polymer is easily removed by other removal operation (for example, the high temperature heat treatment described below) after this cleaning operation.

The rinsing liquid is not particularly limited, but from the viewpoint of improvement in the cleaning efficiency, it is preferable that the rinsing liquid contains a solvent having high polarity.

Since the composition contains a polymer having a cationic functional group and has high polarity, the composition easily dissolves in a solvent having high polarity. Thus, by using a rinsing liquid containing a solvent having high polarity, the removability of the polymer from the member A is further improved.

Specifically, it is preferable that the rinsing liquid contains a polar solvent such as water, methanol, ethanol, propanol, butanol, or propylene glycol monomethyl ether acetate.

Such polar solvents do not significantly damage the interaction between the member B and the polymer. For this reason, even when cleaning is performed using a rinsing liquid that contains such a polar solvent, the polymer on the member B (the polymer layer that works effectively) is less likely to be removed, which is thus preferable.

In the present process, the temperature of the rinsing liquid is from 15° C. to 100° C. This temperature is more preferably from 30° C. to 100° C., still more preferably from 40° C. to 100° C., and particularly preferably from 50° C. to 100° C.

When the temperature of the rinsing liquid is 15° C. or higher (more preferably, 30° C. or higher), the removability of the polymer from the member A is further improved.

When the temperature of the rinsing liquid is 100° C. or lower, evaporation of the rinsing liquid can be further suppressed.

Further, the cleaning in the present process may be carried out, while applying ultrasonic wave to the rinsing liquid.

From the viewpoint of suppressing the oxidization of the member A, it is also preferable that the rinsing liquid contains a reducing agent or a compound having a reducing action. An example of the reducing agent or the compound having a reducing action is formalin.

Further, from the viewpoints of preventing cleavage of a carbon-carbon bond and the like in the polymer of the composition and suppressing the separation of the polymer from the member B, it is preferable that the content of an oxidative compound (for example, hydrogen peroxide or nitric acid) in the rinsing liquid is 10% by mass or lower, and it is more preferable that the rinsing liquid does not contain an oxidative compound.

Further, the rinsing liquid preferably has an ionic strength of 0.003 or more, and preferably 0.01 or more.

When the ionic strength is 0.003 or more, the rinsing liquid dissolves the polymer more easily, and besides, the rinsing liquid does not significantly damage the interaction between the member B and the polymer, which is thus preferable.

There is no particular limitation as to the upper limit of the ionic strength, and it is enough to have an ionic strength of a concentration capable of dissolving an ionic compound.

Note that, the ionic strength is expressed by the following equation.

$$\text{Ionic strength} = \frac{1}{2} \times \Sigma(c \times Z^2)$$

(wherein c represents a molar concentration of the ionic compound included in the rinsing liquid, and Z represents an ionic valence of the ionic compound included in the rinsing liquid.)

In order to adjust the ionic strength, an ionic compound such as an acid described below or an organic base (ammonia, pyridine, ethylamine, or the like) can be added, if necessary.

Moreover, a polymer (for example, polyethyleneimine) that catches metal element ions may be added.

It is also preferable that the rinsing liquid is a rinsing liquid having a pH at 25° C. of 6 or lower (preferably, 5 or lower). By the use of such a rinsing liquid, the removability of the polymer from the member A is further improved. Moreover, a metal oxide that is formed on the member A can be dissolved and removed.

In this case, the lower limit of the pH of the rinsing liquid is not particularly limited, but the pH is preferably 1 or higher, and more preferably 2 or higher.

When the pH is 1 or higher, dissolution of the member B can be further reduced, and thus, the polymer adhered to the member B can be more suitably maintained.

From the viewpoint of effectively achieving both the removability of the polymer from the member A and the persistent quality of the polymer applied to the member B, the pH of the rinsing liquid is preferably from 1 to 6, more preferably from 2 to 5, and particularly preferably from 2 to 4.

It is also preferable that the rinsing liquid (especially, the rinsing liquid having a pH at 25° C. of 6 or lower) contains at least one kind of acid.

The acid is not particularly limited, but an acid which is less likely to pollute or destroy the interlayer insulating layer and is less likely to remain on the semiconductor substrate is preferable. Specific examples of the acid may include monocarboxylic acids such as formic acid or acetic acid; dicarboxylic acids such as oxalic acid, malonic acid, succinic acid, glutaric acid, adipic acid, pimelic acid, maleic acid, fumaric acid, or phthalic acid; tricarboxylic acids such as trimellitic acid or tricarballylic acid; oxymonocarboxylic acids such as hydroxybutyric acid, lactic acid, or salicylic acid; oxydicarboxylic acids such as malic acid or tartaric acid; oxytricarboxylic acids such as citric acid; aminocarboxylic acids such as aspartic acid or glutamic acid; organic acids such as para-toluenesulfonic acid or methanesulfonic acid; and inorganic acids such as hydrochloric acid, nitric acid, or phosphoric acid.

Further, as the acid, an acid, which has, in one molecule, at least one (preferably, both) of a moiety that blocks active species (for example, plasma active species such as radicals, ions, or electrons) or a functional group that forms a bond with the polymer (the polymer having a cationic functional group and having a weight average molecular weight of from 2,000 to 1,000,000) when heated, is also preferable. By having such a configuration, particularly, in the case of performing a plasma treatment (for example, plasma cleaning or plasma CVD) after the cleaning process, the plasma resistance of the polymer layer formed from the above polymer can be improved.

In this acid, the number of the functional groups that form a bond with the polymer when heated, in one molecule, is preferably 1 or more, more preferably 2 or more, and particularly preferably 3 or more.

The moiety that blocks active species is not particularly limited, but specifically, a functional group having a conjugated system or a metal atom is preferable. Specific examples thereof include an aromatic group, a manganese atom, and a silicon atom.

In a case in which the polymer layer contains the above-described polyalkyleneimine (preferably, polyethyleneimine), an example of the functional group that forms a bond with the polymer when heated is a carboxyl group. In this case, the carboxyl group reacts with at least one of the primary amino group or the secondary amino group (imino group) in the polyalkyleneimine, thereby forming an amide bond or an imide bond.

From the viewpoint of improving the plasma resistance of the polymer layer, preferable examples of the acid include, specifically, polyvalent carboxylic acids such as naphthalene tetracarboxylic acid, biphenyl tetracarboxylic acid, benzophenone tetracarboxylic acid, benzene hexacarboxylic acid, pyromellitic acid, trimellitic acid, ethylenediamine tetracarboxylic acid, or citric acid, and barbituric acid. Among them, naphthalene tetracarboxylic acid, biphenyl tetracarboxylic acid, benzophenone tetracarboxylic acid, benzene hexacarboxylic acid, and pyromellitic acid are preferable.

Examples of the plasma include plasma generated from hydrogen gas, helium gas, argon gas, nitrogen gas, ammonia gas, or the like. There is no particular limitation on the conditions for generating the plasma, but conditions of such an extent that the polymer layer formed on the member B is not removed too much are preferred. As examples of such conditions, conditions of a total pressure of from 20 mTorr to 200 mTorr, a gas flow rate of from 20 sccm to 100 sccm, a cathode electrode diameter of from 5 cm to 15 cm, a discharge electric power of from 20 W to 200 W, and a treatment time (discharge time) of from 10 sec to 60 sec, may be exemplified.

There is no particular limitation as to the amounts of the above-described solvent, acid, reducing agent, ionic compound, and the like, which may be incorporated in the rinsing liquid. For example, the above amounts can be adjusted as appropriate such that the pH and ionic strength of the rinsing liquid each fall within the above preferable ranges, respectively.

Further, the rinsing liquid can be prepared by mixing, for example, the above-described solvent, acid, reducing agent, ionic compound, and the like, but in order to prevent the electronic circuit and the like from being polluted, it is preferable to prepare the rinsing liquid under a clean environment such as in a clean room, or to remove the components, which pollute the electronic circuit and the like, by purification, filtration, or the like, after the preparation of the rinsing liquid.

In the present process, the extra polymer layer that is formed on the member A can be rapidly removed by cleaning (rinsed) with the rinsing liquid, while maintaining the effective polymer layer that covers that member B. In addition, as described above, an oxide of a metal element can also be removed and, as a result of which, separation between the member A and a member (an insulating layer, a wiring, a conductive member, or the like) contacting the member A, which may be provided as needs arise, can be suppressed.

Moreover, it is also preferable that the cleaning in the present process is carried out under a non-oxidizing atmosphere. By carrying out cleaning under a non-oxidizing atmosphere, it is possible to prevent the member A from being excessively removed, due to repeatedly performing the action of removing the metal oxide on the member A, which has been present before rinsing, with the rinsing liquid, and thereafter dissolving (removing) the metal oxide, which is produced when the metal element on the surface of the member A is further oxidized, with the rinsing liquid. For example, a reducing atmosphere gas may be used, to realize the non-oxidizing atmosphere.

In the present process, cleaning may be carried out by a commonly used method, and the method is not particularly limited.

The cleaning time is not particularly limited. For example, the cleaning time can be set from 0.1 minutes to 60 minutes, and is more preferably from 0.1 minutes to 10 minutes.

In a case in which the manufacturing method of the invention includes the above heating process (soft bake process) and this cleaning process, regarding the process order, it is preferable to perform the composition application process, the heating process (soft bake process), and the cleaning process in this order.

Further, the cycle including the above processes in this order may be repeated plural times.

<High Temperature Heating Process>

It is preferable that the manufacturing method of the invention further includes a high temperature heating process of heating the composite member to which the composition has been applied, under the condition of a temperature of from 200° C. to 425° C. Hereinafter, this high temperature heating process may be referred to as "hard bake (process)". Here, the temperature above indicates the temperature of the face of the composite member, to which the composition has been applied.

By having this high temperature heating process, the polymer layer formed on the member A is removed preferentially (preferable, selectively) rather than the polymer formed on the member B.

When the temperature is 200° C. or higher, the polymer layer exhibits excellent removability from the composite member.

Further, when the temperature is 425° C. or lower, migration of the member A can be suppressed.

The temperature is preferably from 250° C. to 400° C., and more preferably from 300° C. to 400° C.

The pressure (the pressure of an atmosphere, to which the polymer layer is exposed at the time of heating) when performing heating in the high temperature heating process is not particularly limited, but the absolute pressure is preferably higher than 17 Pa but lower than or equal to the atmospheric pressure.

When the absolute pressure is higher than 17 Pa, the speed of removing the polymer layer is further increased.

When the absolute pressure is lower than or equal to the atmospheric pressure, the speed of removing the polymer layer is more easily adjusted.

The absolute pressure is more preferably 1,000 Pa or higher but lower than or equal to the atmospheric pressure, still more preferably 5,000 Pa or higher but lower than or equal to the atmospheric pressure, and particularly preferably 10,000 Pa or higher but lower than or equal to the atmospheric pressure.

Heating in the high temperature heating process can be carried out by an ordinary method using an oven or a hot plate. As the oven, for example, an SPX-1120 manufactured by APEX Co., Ltd., or a VF-1000LP manufactured by Koyo Thermo Systems Co., Ltd. can be used.

Further, heating in the present process may be carried out under an air atmosphere, but from the viewpoints of suppressing oxidation of the member A and the like, heating is more preferably carried out under an inert gas (nitrogen gas, argon gas, helium gas, or the like) atmosphere and is particularly preferably carried out under a nitrogen gas atmosphere.

The heating time in the high temperature heating process is not particularly limited, and is, for example, 1 hour or less, preferably 30 minutes or less, more preferably 10 minutes or less, and particularly preferably 5 minutes or less. The lower limit of the heating time is not particularly limited, but can be, for example, 0.1 minutes.

When the heating time is 1 hour or less, it is easier to leave the polymer layer on the member B.

In a case in which the manufacturing method of the invention includes the above-described heating process (soft bake process), the cleaning process, and this high temperature heating process (hard bake process), regarding the process order, it is preferable to perform the composition application process, the heating process (soft bake process), the cleaning process, and the high temperature heating process (hard bake process), in this order.

<Other Process>

The manufacturing method of the invention may further include, as other process, processes which are performed in the manufacture of electronic devices (for example, semiconductor devices), such as a plasma treatment process of performing the plasma treatment described above, a wiring formation process, or a barrier layer formation process, if necessary.

The wiring formation process can be carried out in accordance with a known method, such as a metal CVD method, a sputtering method, or an electroplating method.

In a case in which the manufacturing method of the invention has a wiring formation process, the manufacturing method may further have a barrier layer (copper barrier layer) formation process, before the wiring formation process. By the formation of a barrier layer, diffusion of a metal component or a plasma component into the member B can be suppressed more effectively.

The barrier layer formation process can be carried out in accordance with commonly used process conditions. A barrier layer formed of a titanium compound (titanium nitride or the like), a tantalum compound (tantalum nitride or the like), a ruthenium compound, a manganese compound, a cobalt compound (CoW or the like), a tungsten compound, or the like can be formed, for example, in accordance with a vapor phase growth method (CVD).

Moreover, in a case in which the manufacturing method of the invention has a cleaning process, the manufacturing method may include a post-rinsing process of further cleaning the rinsing liquid remaining on the composite body, after the cleaning process. With regard to the post-rinsing process, description in paragraph 0093 of WO 2012/033172 can be referred to, as appropriate.

The method for manufacturing a composite body of the invention as described above is particularly preferable as the method for manufacturing various electronic devices (a print wiring substrate, a semiconductor device, a substrate for a display device, or the like) as the composite body.

An example of the composite body to be manufactured by the method for manufacturing a composite body of the invention is a composite body, which has a structure in which an insulating layer that serves as the member B, a polymer layer that contains a polymer having a cationic functional group and having a weight average molecular weight of from 2,000 to 1,000,000, and a wiring that serves as the member A are disposed in this order, and in which the thickness of the polymer layer at a part where the wiring does not face the insulating layer is 5 nm or less (preferably 3 nm or less, more preferably 2 nm or less, particularly preferably 1 nm or less, and most preferably 0 nm (namely, the polymer layer does not exist)).

In the above example, a second wiring may be formed at a part where the above wiring (hereinafter, also referred to as "first wiring") does not face the insulating layer, whereby the first wiring and the second wiring may be electrically connected. In this case, since the thickness of the polymer layer between the first wiring and the second wiring is 5 nm or less as described above, the two wirings have excellent electrical connectivity.

A semiconductor device which is a further specific example of the composite body according to the above example is a semiconductor device, which has, on a semiconductor substrate, an interlayer insulating layer, a first wiring containing copper, a semiconductor polymer layer that exists between the interlayer insulating layer and the first wiring, and contains a polymer having a cationic functional group and having a weight average molecular weight of from 2,000 to 1,000,000, and a second wiring that contains copper and is electrically connected to the first wiring, and in which the thickness of the semiconductor polymer layer in the connecting part between the first wiring and the second wiring is 5 nm or less.

EXAMPLES

Hereinafter, the present invention is specifically described with reference to Examples; however, the present invention is by no means limited to these Examples.

In the following, for "water", ultrapure water (MILLI-Q WATER, manufactured by Millipore Corporation; resistivity of 18 MΩ·cm (at 25° C.) or less) was used.

Example 1A

<<Preparation of Composition>>

As described below, highly branched polyethyleneimine 1 (a polyethyleneimine that is highly branched) was synthesized, and subsequently, a composition containing the obtained highly branched polyethyleneimine 1 was prepared. Details are explained below.

<Synthesis of Highly Branched Polyethyleneimine 1>

(Synthesis of Modified Polyethyleneimine 1)

Modified polyethyleneimine 1 was synthesized according to the following Reaction Scheme 1, using polyethyleneimine as the starting material. It should be noted that the polymer structures in the following Reaction Scheme 1 and Reaction Scheme 2 are structures that are represented schematically, and the configuration of the tertiary nitrogen atom and the secondary nitrogen atom, and the proportion of the secondary nitrogen atom to be substituted by a Boc-aminoethyl group as described below may change variously, depending on the synthesis condition.

-Reaction Scheme 1-

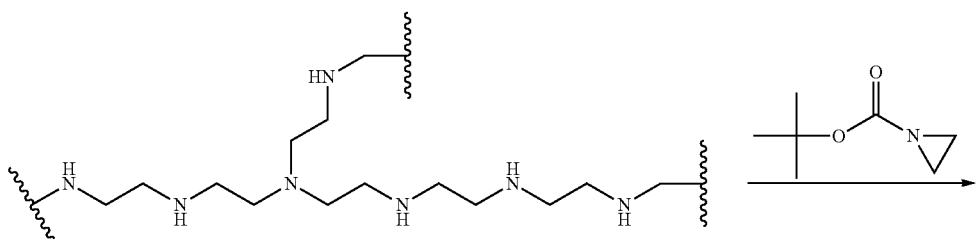

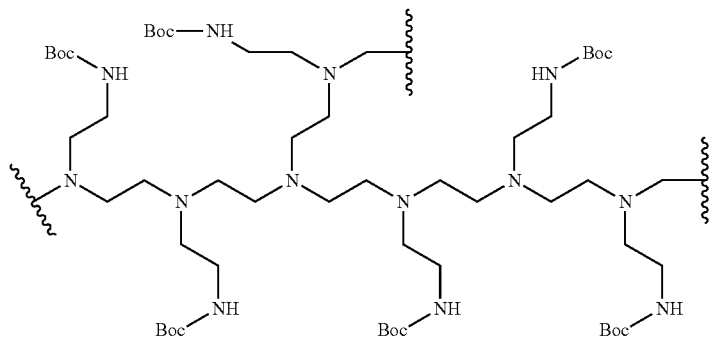

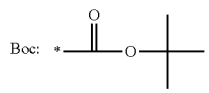

The detailed operation of Reaction Scheme 1 above is as follows.

61.06 g of polyethyleneimine (50% aqueous solution) manufactured by MP Biomedicals Inc. were dissolved in 319 mL of isopropanol, and then 102 g (710 mmol) of N-t-butoxycarbonyl (in Examples, the "t-butoxycarbonyl group" is also referred to as "Boa") aziridine were added thereto. The resulting mixture was heated under reflux for 3 hours, to obtain modified polyethyleneimine 1 having a structure in which a Boc-aminoethyl group is introduced into polyethyleneimine. It was confirmed, by thin layer chromatography (TLC), that N-Boc aziridine as the raw material was not present. Then, a small amount of the product was sampled, and the structure was confirmed by $^1$H-NMR. From the results of the $^1$H-NMR analysis, the introduction rate of the Boc-aminoethyl group with respect to polyethyleneimine was calculated to be 95%.

—NMR Measurement Results of Modified Polyethyleneimine 1—

$^1$H-NMR (CD$_3$OD); δ3.3-3.0 (br. s, 2), 2.8-2.5 (Br. s, 6.2), 1.45 (s, 9)

(Synthesis of Highly Branched Polyethyleneimine 1)

Highly branched polyethyleneimine 1 was synthesized according to the following Reaction Scheme 2, using the modified polyethyleneimine 1 as the starting material.

184 mL of methanol. The reaction product that had been washed was dissolved in water, and chlorine ions were removed by using an anion exchange polymer, to obtain an aqueous solution containing 58 g of highly branched polyethyleneimine 1.

—NMR Measurement Results of Highly Branched Polyethyleneimine 1—

$^1$H-NMR (D$_2$O); δ 2.8-2.4 (br. m)

$^{13}$C-NMR (D$_2$O); δ (integration ratio) 57.2 (1.0), 54.1 (0.38), 52.2 (2.26), 51.6 (0.27), 48.5 (0.07), 46.7 (0.37), 40.8 (0.19), 38.8 (1.06).

With regard to the highly branched polyethyleneimine 1, the weight average molecular weight, the molecular weight distribution, the cationic functional group (primary nitrogen atom, secondary nitrogen atom, tertiary nitrogen atom, and quaternary nitrogen atom) equivalent weight, the amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree (%) were measured, respectively.

As a result, the weight average molecular weight was 40,575, the molecular weight distribution was 17.47, the cationic functional group equivalent weight was 43, the amount of primary nitrogen atom was 46% by mole, the

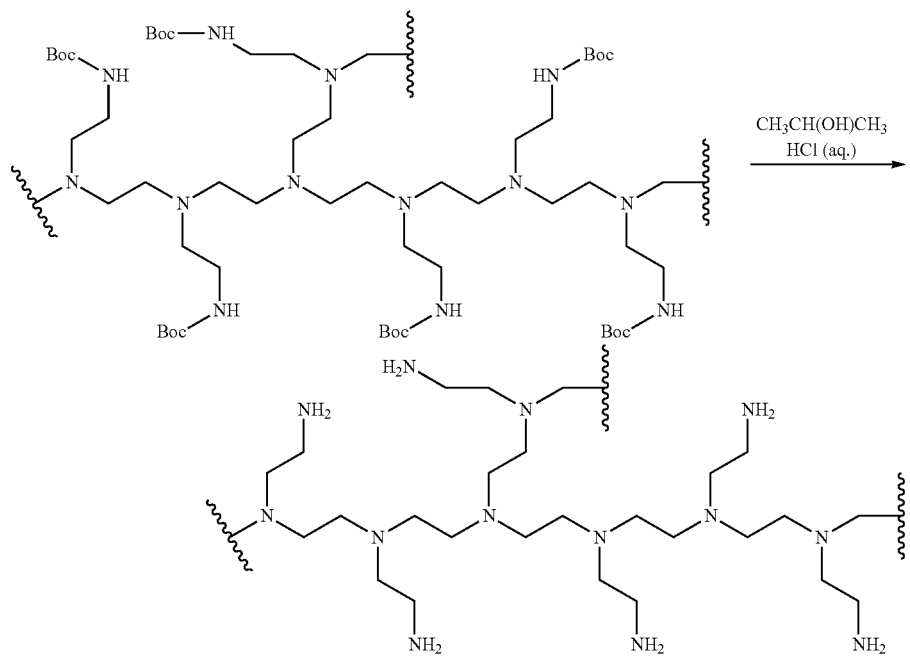

-Reaction Scheme 2-

The detailed operation of Reaction Scheme 2 above is as follows.

124 mL of 12N hydrochloric acid were slowly added to the isopropanol solution of modified polyethyleneimine 1. The solution thus obtained was stirred under heating at 50° C. for 4 hours, while being careful about generation of gas. Together with the generation of gas, a gum-like reaction product was generated in the reaction system. After the completion of the generation of gas, the reaction system was cooled. After cooling, the solvent that had been separated from this gum-like reaction product was removed, and then the resulting reaction product was washed three times with amount of secondary nitrogen atom was 11% by mole, the amount of tertiary nitrogen atom was 43% by mole, the amount of quaternary nitrogen atom was 0% by mole, and the branching degree was 80%.

Here, the cationic functional group equivalent weight is a value of the molecular weight with respect to one cationic functional group, and can be calculated based on the polymer structure.

Further, the amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree (%) were determined as follows. Namely, the polymer sample (highly branched polyethyleneimine 1) was dissolved in heavy water, and with regard to the resulting solution, $^{13}$C-NMR measurement was performed at 80° C., using an AVANCE 500 type nuclear magnetic resonance apparatus, manufactured by Bruker Corporation, in accordance with the single pulse inverse gated decoupling method. Based on the measurement results, analysis was conducted to determine what type of amine (nitrogen atom) each of the carbon atom bonds to, and the above amounts and the branching degree were calculated based on the integrated value thereof. The assignment is described in European Polymer Journal, vol. 9, page 559, 1973, and the like.

The weight average molecular weight and the molecular weight distribution were measured using an analyzer SHODEX GPC-101 and using a column ASAHIPAK GF-7M HQ, and calculated using polyethylene glycol as the reference standard. Further, as the eluent, an aqueous solution having an acetic acid concentration of 0.5 mol/L and a sodium nitrate concentration of 0.1 mol/L was used. However, as is known in the Mark-Houwink-Sakurada equation, the calibration curve of GPC changes as the branching degree increases, and thus, the obtained weight average molecular weight and molecular weight distribution should only be considered as numerical values in terms of polyethylene glycol.

Here, the amount (% by mole) of primary nitrogen atom, the amount (% by mole) of secondary nitrogen atom, the amount (% by mole) of tertiary nitrogen atom, and the amount (% by mole) of quaternary nitrogen atom are amounts represented by the following Equations A to D, respectively. The branching degree was determined according to the following Equation E.

Amount (% by mole) of primary nitrogen atom= (molar number of primary nitrogen atom/(molar number of primary nitrogen atom+molar number of secondary nitrogen atom+molar number of tertiary nitrogen atom+molar number of quaternary nitrogen atom))×100   Equation A Amount (% by mole) of secondary nitrogen atom= (molar number of secondary nitrogen atom/ (molar number of primary nitrogen atom+molar number of secondary nitrogen atom+molar number of tertiary nitrogen atom+molar number of quaternary nitrogen atom))×100   Equation B Amount (% by mole) of tertiary nitrogen atom=(molar number of tertiary nitrogen atom/(molar number of primary nitrogen atom+molar number of secondary nitrogen atom+molar number of tertiary nitrogen atom+molar number of quaternary nitrogen atom))×100   Equation C Amount (% by mole) of quaternary nitrogen atom= (molar number of quaternary nitrogen atom/ (molar number of primary nitrogen atom+molar number of secondary nitrogen atom+molar number of tertiary nitrogen atom+molar number of quaternary nitrogen atom))×100   Equation D Branching degree (%)=((amount (% by mole) of tertiary nitrogen atom+amount (% by mole) of quaternary nitrogen atom)/(amount (% by mole) of secondary nitrogen atom+amount (% by mole) of tertiary nitrogen atom+amount (% by mole) of quaternary nitrogen atom)×100   Equation E <Preparation of Composition>

To the aqueous solution of highly branched polyethyleneimine 1 (weight average molecular weight: 40,575, cationic functional group equivalent weight: 43) obtained as described above, water and formic acid were added and mixed, to obtain a composition.

In Example 1A, the addition amounts of water and formic acid were such amounts that the concentration of the highly branched polyethyleneimine 1 in the composition became 0.25% by mass, and the pH of the composition became 5.0. The "pH" used herein is a value obtained by measurement with regard to the composition at 25° C. (hereinafter, the same applies.). Here, the pH of the composition was measured as follows. Namely, the composition was added dropwise onto litmus paper (three kinds of indicators were used; measurement range: from 2.0 to 9.0) manufactured by MACHEREY-NAGEL, GmbH & Co. KG, and subsequently, the excess composition was removed. Then, the color was read out quickly, thereby measuring the pH. Particularly, in a case in which plural indicators are reacted and discolored, the average value is designated as the read out value (pH).

The content of sodium and the content of potassium in the obtained composition were each measured using an inductively coupled plasma mass spectrometer (ICP-MS) and, as a result, the contents were both less than or equal to the detection limit (<1 ppb by mass).

<<Measurement of Thickness of Polymer Layer on Silicon (Si)>>

<Formation of Polymer Layer (Application of Composition)>

First, a silicon wafer was prepared, as the member B. Silica exists on the surface of the silicon wafer.

The isoelectric point of this surface is from 1.0 to 3.0 (G. A. Parks, Chemical Reviews, vol. 65, pages 177 to 198 (1965)).

The silicon wafer was placed on a spin coater, and 1.0 mL of the composition were added dropwise for 10 seconds at a constant speed, and the silicon wafer was maintained for 13 seconds. Then, the silicon wafer was rotated at 2,000 rpm for 1 second and at 600 rpm for 30 seconds, and then further rotated at 2,000 rpm for 10 seconds, to perform drying.

In this way, a layer (polymer layer) containing the polymer contained in the composition was formed on the silicon wafer, thereby obtaining a laminated body (hereinafter also referred to as "Sample (Si/PEI)") having a structure in which the silicon wafer and the polymer layer are layered one on another.

<Soft Bake (Heat Treatment)>

The above Sample (Si/PEI) was placed on a hot plate, and subjected to soft bake (heat treatment) at a soft bake temperature of 80° C. for 60 seconds, under an air atmosphere.

The "soft bake temperature" used herein is a temperature of the silicon wafer surface.

<Cleaning Treatment>

The Sample (Si/PEI) that had been subjected to the soft bake was rotated at 600 rpm, using a spin coater, and while rotating, an aqueous solution of pyromellitic acid (pH 4, liquid temperature 22° C.) as the rinsing liquid was added dropwise onto the polymer layer at a dropwise addition speed of 0.1 mL/sec for 30 seconds, thereby cleaning the polymer layer. Subsequently, ultrapure water (at a liquid temperature of 22° C.) was added dropwise at a dropwise addition speed of 0.1 mL/sec for 30 seconds, then the sample was rotated at 4,000 rpm for 60 seconds to perform drying.

<Measurement of Thickness of Polymer Layer>

With regard to the Sample (Si/PEI) that had been dried in the cleaning treatment, the thickness (nm) of the polymer layer on silicon (Si) was measured by an ordinary method using an ellipsometer of an optical porosimeter (PS-1200, manufactured by SEMILAB CO., LTD.).

The measurement results are shown in Table 1.

<<Measurement of Thickness of Polymer Layer on Copper (Cu)>>

First, a copper (Cu) substrate as the member A was prepared.

Next, the thickness of the polymer layer on copper (Cu) was measured in a manner similar to that in the measurement of the thickness of the polymer layer on silicon (Si), except that, in the above measurement of the thickness of the polymer layer on silicon (Si), the silicon wafer was changed to the copper (Cu) substrate. Hereinafter, the sample in this measurement is also referred to as "Sample (Cu/PEI)".

The measurement of the thickness of the polymer layer on copper was carried out, specifically, in a manner as described below.

Namely, the thickness of the polymer layer on an optically flat copper substrate was calculated by regressing the polarization parameter measured according to ellipsometry in a multilayer optical model; (air)/(polymer layer)/(copper substrate), using WINELLI II. The range of the light energy used is from 2.2 eV to 5.0 eV. Here, for the refractive index of the polymer layer, always, the same value as that of silica ($SiO_2$) was used. Further, for the refractive index and extinction coefficient of the copper substrate, the values determined by using an analysis software WINELLI II, after measuring the polarization parameter of a copper substrate that does not have thereon a polymer layer, were used.

Note that, a copper oxide layer having a thickness of about 4 nm is present on the surface of the copper substrate, and this copper oxide layer is removed by reduction after the hard bake (high temperature heat treatment), and thus, according to the above calculation method, the thickness of the polymer layer after the hard bake may show a minus value. Therefore, in the calculation of the thickness of the polymer layer on copper after the hard bake described below (Examples 1C, 3C, and 6C to 11C), a copper substrate that does not have thereon a polymer layer was subjected to hard bake, and the refractive index and extinction coefficient of the resulting copper substrate after the hard bake were determined according to the same method as the measurement method above, and depending on these values, the thickness of the polymer layer on copper after the hard bake was determined according to the same method as the measurement method above.

The measurement results are shown in Table 1.

Note that, the isoelectric point of the surface of this copper substrate is from 7.6 to 9.5 (G A. Parks, Chemical Reviews, vol. 65, pages 177 to 198 (1965)).

That is, the difference between the isoelectric point of the surface of the silicon wafer and the isoelectric point of the surface of the copper substrate is from 4.6 to 8.5.

When the thickness of the polymer layer on copper (Cu) is less than 75% of the thickness (nm) of the polymer layer on silicon (Si), the thickness of the polymer layer on Si is deemed as thick and the thickness of the polymer layer on Cu is deemed as thin.

Examples 2A to 4A

Measurement of the thickness of the polymer layer on silicon (Si) and measurement of the thickness of the polymer layer on copper (Cu) were carried out in a manner similar to that in Example 1A, except that the soft bake temperature in Example 1A was changed as shown in Table 1 below.

The measurement results are shown in Table 1.

Examples 1B to 4B, and Comparative Examples 1 to 2

Measurement of the thickness of the polymer layer on silicon (Si) and measurement of the thickness of the polymer layer on copper (Cu) were carried out in a manner similar to that in Example 3A, except that the pH of the composition in Example 3A was changed as shown in Table 2 below.

The measurement results are shown in Table 2.

Here, the change in pH in Examples 1B to 4B and Comparative Example 1 was conducted by changing the addition amount of formic acid. Further, the change in pH in Comparative Example 2 was conducted by the absence of addition of formic acid.

Figure 4:
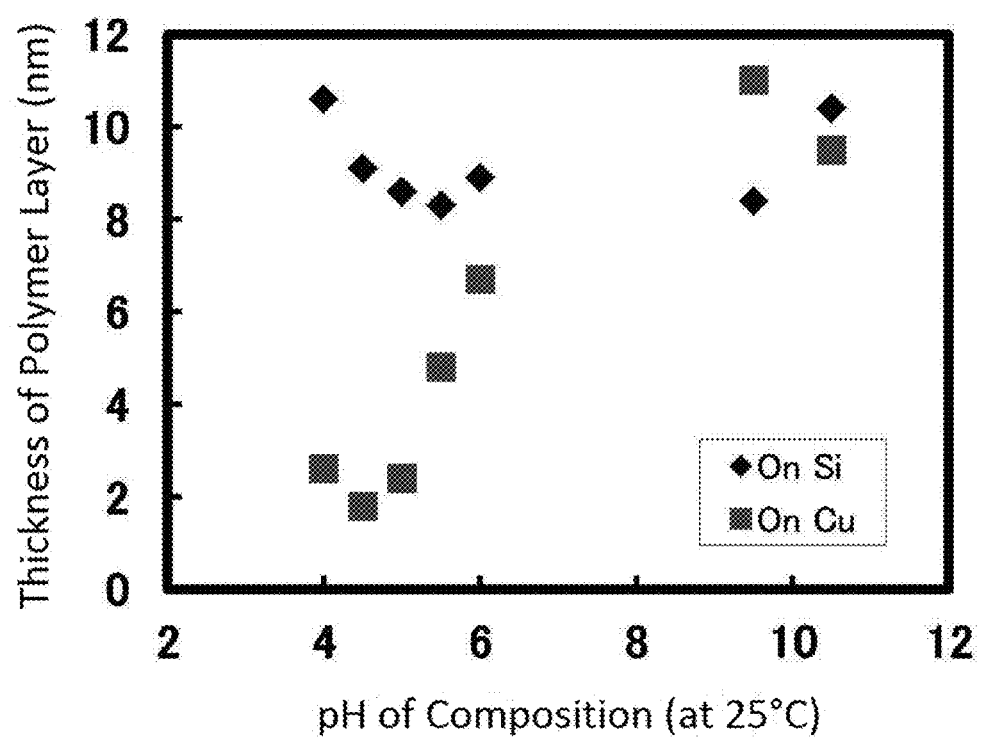
FIG. 4 is a graph showing the relationship between the pH of the composition and, the thickness of the polymer layer on Si and the thickness of the polymer layer on Cu, in Examples and Comparative Examples.

For comparison, the results with regard to Example 3A are also included in Table 2 and FIG. 4.

TABLE 1

|  | Soft Bake Temperature (° C.) | Thickness of Polymer Layer on Si (nm) | Thickness of Polymer Layer on Cu (nm) |
| --- | --- | --- | --- |
| Example 1A | 80 | 3.5 | 1.7 |
| Example 2A | 90 | 7.4 | 2.9 |
| Example 3A | 100 | 8.6 | 2.4 |
| Example 4A | 110 | 8.3 | 3.5 |

TABLE 2

|  | pH of Composition (at 25° C.) | Thickness of Polymer Layer on Si (nm) | Thickness of Polymer Layer on Cu (nm) |
| --- | --- | --- | --- |
| Example 1B | 4.0 | 10.6 | 2.6 |
| Example 2B | 4.5 | 9.1 | 1.8 |
| Example 3A | 5.0 | 8.6 | 2.4 |
| Example 3B | 5.5 | 8.3 | 4.8 |
| Example 4B | 6.0 | 8.9 | 6.7 |
| Comparative Example 1 | 9.5 | 8.4 | 11.0 |
| Comparative Example 2 | 10.5 | 10.4 | 9.5 |

Figure 3:
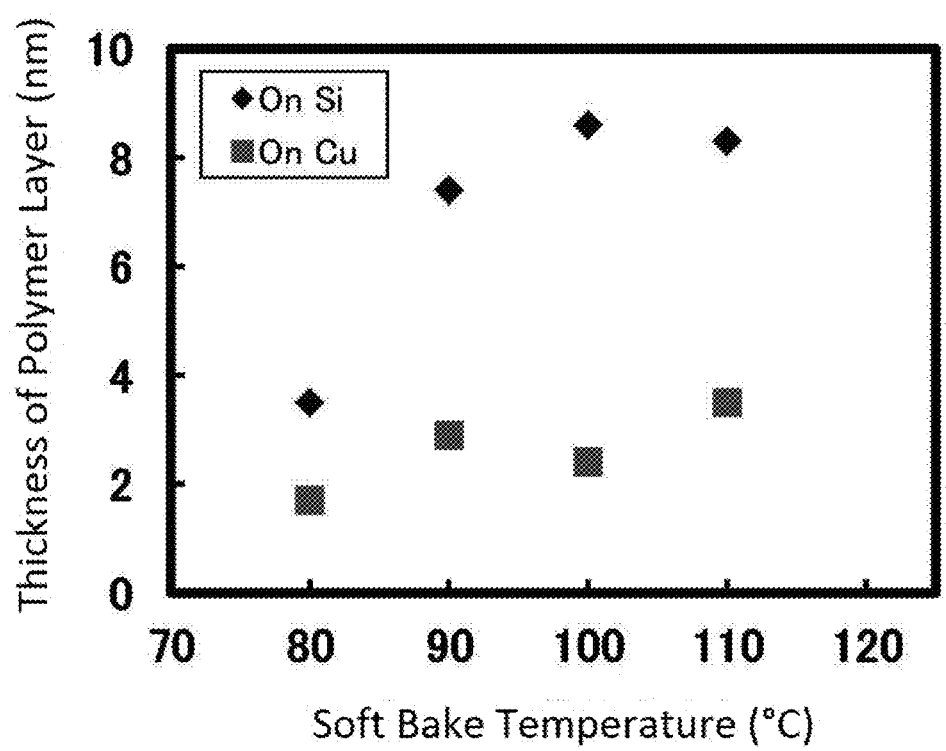
FIG. 3 is a graph showing the relationship between the soft bake temperature and, the thickness of the polymer layer on Si and the thickness of the polymer layer on Cu, in Examples.

FIG. 3 is a graph in which the results shown in Table 1 above are plotted, and specifically, is a graph showing the relationship between the soft bake temperature and, the thickness of the polymer layer on Si and the thickness of the polymer layer on Cu.

FIG. 4 is a graph in which the results shown in Table 2 above are plotted, and specifically, is a graph showing the relationship between the pH of the composition and, the thickness of the polymer layer on Si and the thickness of the polymer layer on Cu.

In FIG. 3 and FIG. 4, "On Si" is a plot showing the thickness of the polymer layer on Si, and "On Cu" is a plot showing the thickness of the polymer layer on Cu.

As shown in Table 2 and FIG. 4, it is understood that, in Examples 1B to 4B and 3A, in which the relationship: the isoelectric point of the surface of the silicon wafer (member B)<the pH of the composition<the isoelectric point of the surface of the Cu substrate (member A) is satisfied, the thickness of the polymer layer on Si is relatively thick and the thickness of the polymer layer on Cu is relatively thin.

Further, as shown in Table 1 and FIG. 3, it is understood that when the soft bake temperature is within the range shown in Table 1 and FIG. 3, the thickness of the polymer layer on Si is relatively thick and the thickness of the polymer layer on Cu is relatively thin.

From the above results, it is confirmed that, in Examples, the polymer layer on Si after cleaning has excellent persistent quality, and the polymer layer exhibits excellent removability from Cu by cleaning.

Examples 13B to 18B

Measurement of the thickness of the polymer layer on silicon (Si) and measurement of the thickness of the polymer layer on copper (Cu) were carried out in a manner similar to that in Example 3A, except that the pH of the composition in Example 3A was changed as shown in Table 3 below, and the measurement of the pH of the composition was carried out as follows.

The measurement results are shown in Table 3.

Here, the change in pH in Examples 13B to 18B was conducted by changing the addition amount of formic acid. Further, measurement of the pH of the composition was carried out as follows. Namely, a pH meter (a pH meter KR5E, manufactured by AS ONE Corporation) was calibrated with a standard liquid pH 4.01 and a standard liquid pH 6.86, and then, the electrode of this pH meter was dipped in the composition, thereby measuring the pH value.

TABLE 3

| | pH of Composition (at 25° C.) | Thickness of Polymer Layer on Si (nm) | Thickness of Polymer Layer on Cu (nm) |
|---|---|---|---|
| Example 13B | 3.28 | 8.2 | −1.0 |
| Example 14B | 3.83 | 8.5 | −0.8 |
| Example 15B | 4.05 | 10.3 | 1.3 |
| Example 16B | 4.39 | 8.9 | 4.3 |
| Example 17B | 4.99 | 8.7 | 3.9 |
| Example 18B | 6.22 | 9.7 | 6.0 |

As shown in Table 3, it is confirmed that, also in Examples 13B to 18B, the thickness of the polymer layer on Si is relatively thick and the thickness of the polymer layer on Cu is relatively thin. Particularly, in Examples 13B and 14B, since the copper oxide on the surface of the copper (Cu) that served as the substrate was etched by acid, the thickness of the polymer layer on copper (Cu) was a minus numerical value.

Example 19B

Measurement of the thickness of the polymer layer on silicon (Si) and measurement of the thickness of the polymer layer on copper (Cu) were carried out in a manner similar to that in Example 3A above, except that, in Example 3A, the highly branched polyethyleneimine 1 was changed to the same mass of polyethyleneimine 2 (polyethyleneimine, manufactured by MP Biomedicals, LLC), the pH of the composition was changed as shown in Table 4 below, and the measurement of the pH of the composition was carried out as follows.

Here, the change in pH in Example 19B was conducted by changing the addition amount of formic acid. Further, measurement of the pH of the composition in Example 19B was carried out as follows. Namely, a pH meter (a pH meter KR5E, manufactured by AS ONE Corporation) was calibrated with a standard liquid pH 4.01 and a standard liquid pH 6.86, and then, the electrode of this pH meter was dipped in the composition, thereby measuring the pH value.

The measurement results are shown in Table 4.

With regard to the polyethyleneimine 2, the weight average molecular weight, the molecular weight distribution, the cationic functional group (primary nitrogen atom, secondary nitrogen atom, tertiary nitrogen atom, and quaternary nitrogen atom) equivalent weight, the amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree (%) were measured, respectively, similar to the highly branched polyethyleneimine 1.

As a result, the weight average molecular weight was 130,774, the molecular weight distribution was 16.55, the cationic functional group equivalent weight was 43, the amount of primary nitrogen atom was 32% by mole, the amount of secondary nitrogen atom was 38% by mole, the amount of tertiary nitrogen atom was 30% by mole, the amount of quaternary nitrogen atom was 0% by mole, and the branching degree was 44%.

TABLE 4

| | pH of Composition (at 25° C.) | Thickness of Polymer Layer on Si (nm) | Thickness of Polymer Layer on Cu (nm) |
|---|---|---|---|
| Example 19B | 4.16 | 11.9 | 1.3 |

As shown in Table 4, it is confirmed that, also in Example 19B, the thickness of the polymer layer on Si is relatively thick and the thickness of the polymer layer on Cu is relatively thin.

Example 3C

<<Measurement of Thickness of Polymer Layer on Silicon (Si)>>

<Hard Bake (High Temperature Heat Treatment)>

The Sample (Si/PEI) of Example 3A above, which had been dried in the cleaning treatment, was placed in an oven (SPX-1120, manufactured by APEX Co., Ltd.), and the side of this sample at which the polymer layer (PEI) had been formed was subjected to hard bake (high temperature heat treatment) at a temperature of 350° C. for 2 minutes, in a nitrogen gas ($N_2$) atmosphere under the condition of a pressure of 10,000 Pa. Here, the temperature above indicates the temperature of the PEI surface of the Sample (Si/PEI).

<Measurement of Thickness of Polymer Layer on Silicon (Si)>

With regard to the Sample (Si/PEI) after the hard bake (high temperature heat treatment), the thickness (nm) of the polymer layer on silicon (Si) was measured by an ordinary method, using an ellipsometer of an optical porosimeter (PS-1200), manufactured by SEMILAB CO., LTD.

The thickness of the polymer layer on silicon (Si) was 4.7 nm, and the thickness (8.6 nm) of the polymer layer in the Sample (Si/PEI) that had been dried in the cleaning treatment was maintained to a certain extent.

<<Measurement of Thickness of Polymer Layer on Copper (Cu)>>

The "Sample (Cu/PEI)" of Example 3A above, which had been dried in the cleaning treatment, was subjected to hard bake (high temperature heat treatment) as described above.

With regard to the "Sample (Cu/PEI)" after the hard bake (high temperature heat treatment), the thickness of the polymer layer on copper (Cu) was measured in a manner similar to that in the measurement of the thickness of the polymer layer on silicon (Si).

The thickness of the polymer layer on copper (Cu) was 0.3 nm, and was further reduced, as compared with the thickness (2.4 nm) of the polymer layer in the Sample 5 (Cu/PEI) that had been dried in the cleaning treatment.

Examples 6B to 12B

Preparation of compositions was conducted through adding acetic acid, propionic acid, picolinic acid, or citric acid, instead of adding formic acid in Example 1A, to obtain compositions. The addition amounts of acids were each such an amount that the concentration of the highly branched polyethyleneimine 1 in the composition became 0.25% by mass and the pH of the composition became the numerical value described in Table 5.

Subsequently, the soft bake, cleaning treatment, measurement of the thickness of the polymer layer, and measurement of the thickness of the polymer layer on copper were conducted in a manner similar to that in Example 1A, except that the soft bake temperature was changed to 100° C.

The measurement results are shown in Table 5.

TABLE 5

| | Added Acid | pH of Composition (at 25° C.) | Thickness of Polymer Layer on Si (nm) | Thickness of Polymer Layer on Cu (nm) |
|---|---|---|---|---|
| Example 6B | Acetic acid | 4.5 | 8.4 | −3.8 |
| Example 7B | Acetic acid | 5.5 | 8.5 | −3.9 |
| Example 8B | Acetic acid | 6.0 | 8.8 | 3.8 |
| Example 9B | Propionic acid | 4.5 | 6.0 | −3.7 |
| Example 10B | Propionic acid | 5.5 | 8.7 | −3.6 |
| Example 11B | Picolinic acid | 6.0 | 6.8 | −3.4 |
| Example 12B | Citric acid | 4.0 | 2.8 | 0.5 |

As shown in Table 5, in Examples 6B to 12B, the thickness of the polymer layer on copper (Cu) was significantly reduced, as compared with the thickness of the polymer layer on silicon (Si).

Particularly, in Examples 6B, 7B, and 9B to 11B, a polymer layer was not observed on the copper (Cu). Since the copper oxide on the surface of the copper (Cu) that serves as the substrate was etched by acid, the thickness of the polymer layer on copper (Cu) was a minus numerical value.

Examples 1C, and 6C to 11C

The samples of Examples 1B and 6B to 11B, which had been dried in the cleaning treatment, were each subjected to hard bake (high temperature heat treatment) similar to Example 3C. Measurement of the thickness of the polymer layer on silicon and measurement of the thickness of the polymer layer on copper were carried out, similar to Example 3C.

The measurement results are shown in Table 6.

TABLE 6

| | Added Acid | pH of Composition (at 25° C.) | Thickness of Polymer Layer on Si (nm) | Thickness of Polymer Layer on Cu (nm) |
|---|---|---|---|---|
| Example 1C | Formic acid | 4.0 | 5.8 | 0.4 |
| Example 6C | Acetic acid | 4.5 | 5.1 | 0.7 |

TABLE 6-continued

| | Added Acid | pH of Composition (at 25° C.) | Thickness of Polymer Layer on Si (nm) | Thickness of Polymer Layer on Cu (nm) |
|---|---|---|---|---|
| Example 7C | Acetic acid | 5.5 | 5.0 | 0.7 |
| Example 8C | Acetic acid | 6.0 | 5.3 | 1.0 |
| Example 9C | Propionic acid | 4.5 | 3.5 | 0.8 |
| Example 10C | Propionic acid | 5.5 | 4.4 | 0.8 |
| Example 11C | Picolinic acid | 6.0 | 4.1 | 0.4 |

As shown in Table 6, in all the cases of using formic acid, acetic acid, propionic acid, or picolinic acid, the thickness of the polymer layer on copper (Cu) was 1 nm or less, and was significantly reduced, as compared with the thickness of the polymer layer on silicon (Si).

Example 3D and Comparative Example 2D

Measurement of the thickness of the polymer layer on silicon and measurement of the thickness of the polymer layer on copper were conducted in a manner similar to that in Example 3A and Comparative Example 2, except that the substances obtained by treating the surface of the silicon wafer and the surface of the copper (Cu) substrate with benzotriazole (BTA) were used. However, in the measurement of the thickness of the polymer layer on copper, polarization parameters of a copper substrate that does not have thereon a polymer layer and that had been subjected to BTA treatment were measured, and then the refractive index and the extinction coefficient were determined by calculation, and these values were used as the polarization parameters of the copper substrate in a multilayer optical model; (air)/(polymer layer)/(copper substrate).

Pretreatment of the substrates using benzotriazole was conducted as follows.

A silicon wafer and a copper substrate were annealed in a nitrogen atmosphere at 20 Pa, at a substrate surface temperature of 350° C., for 10 minutes. Thereafter, the resulting substrates were dipped in a 1N sulfuric acid aqueous solution for 5 minutes and, after the dipping, washed with pure water for 5 minutes, and subsequently, dipped in a 0.0046% by mass aqueous solution of BTA for 5 minutes, and then washed with pure water for 5 minutes.

The measurement results are shown in Table 7.

TABLE 7

| | Added Acid | pH of Composition (at 25° C.) | Thickness of Polymer Layer on Si (nm) | Thickness of Polymer Layer on Cu (nm) |
|---|---|---|---|---|
| Example 3D | Formic acid | 5.0 | 8.5 | 0.2 |
| Comparative Example 2D | none | 10.5 | 6.6 | 9.8 |

As shown in Table 7, in Example 3D, the thickness of the polymer layer on copper (Cu) was 0.2 nm. Accordingly, by subjecting the copper (Cu) surface to the BTA treatment, the amount of the polymer adhered was smaller by about 2 nm in thickness, as compared with Example 3A (Table 1) that was not subjected to the BET treatment.

In Comparative Example 2D, the thickness of the polymer layer on copper (Cu) was 9.8 nm, and the polymer remained thick.

Examples 9E and 10E

In Examples 9E and 10E, samples that had not been subjected to cleaning treatment were prepared. Namely, after forming the polymer layer on a silicon wafer and on a copper substrate, respectively, samples that had been subjected to the soft bake were prepared. With regard to these samples, measurement of the thickness of the polymer layer and measurement of the thickness of the polymer layer on copper were carried out, similar to Example 1A.

The measurement results are shown in Table 8.

TABLE 8

|  | Added Acid | pH of Composition (at 25° C.) | Thickness of Polymer Layer on Si (nm) | Thickness of Polymer Layer on Cu (nm) |
|---|---|---|---|---|
| Example 9E | Propionic acid | 4.5 | 3.8 | −2.3 |
| Example 10E | Propionic acid | 5.5 | 8.3 | −2.1 |

As shown in Table 8, in Examples 9E and 10E, a polymer layer was not observed on the copper (Cu). Since the copper oxide on the surface of the copper (Cu) that serves as the substrate was etched by acid, the thickness of the polymer layer on copper (Cu) was a minus numerical value.

The disclosures of Japanese Patent Application No. 2013-067452 filed on Mar. 27, 2013 and Japanese Patent Application No. 2013-179751 filed on Aug. 30, 2013 are incorporated by reference herein in their entirety.

All publications, patent applications, and technical standards mentioned in this specification are herein incorporated by reference to the same extent as if such individual publication, patent application, or technical standard was specifically and individually indicated to be incorporated by reference.

The invention claimed is:

1. A method for manufacturing a composite body, the method comprising:
   a composition preparation process of preparing a composition that contains a polymer having a cationic functional group and having a weight average molecular weight of from 2,000 to 1,000,000, and a monocarboxylic acid compound, and that has a pH of from 2.0 to 11.0;
   a composite member preparation process of preparing a composite member that includes a member A and a member B, a surface of the member B having an isoelectric point that is lower than an isoelectric point of a surface of the member A by 2.0 or more and the isoelectric point of the member B being from 1.0 to 7.5, and that satisfies a relationship: the isoelectric point of a surface of the member B<the pH of the composition<the isoelectric point of a surface of the member A; and
   an application process of applying the composition to the surface of the member A and the surface of the member B included in the composite member.

2. The method for manufacturing a composite body according to claim 1, wherein the member A contains at least one element selected from the group consisting of Cu, Al, Ti, Fe, Sn, Cr, Mn, Ni, Pt, Zn and Mg, and the member B contains silica.

3. The method for manufacturing a composite body according to claim 1, wherein the member A contains Cu, and the member B contains silica.

4. The method for manufacturing a composite body according to claim 1, wherein a content of sodium and a content of potassium in the composition are each 10 ppb by mass or less, on an elemental basis.

5. The method for manufacturing a composite body according to claim 1, the method further comprising a heating process of heating the composite member to which the composition has been applied, under a condition of a temperature of from 70° C. to 125° C.

6. The method for manufacturing a composite body according to claim 1, wherein the member B contains a porous material.

7. The method for manufacturing a composite body according to claim 1, wherein the polymer has a cationic functional group equivalent weight of from 27 to 430.

8. The method for manufacturing a composite body according to claim 1, wherein the polymer is a polyethyleneimine or a derivative of a polyethyleneimine.

9. The method for manufacturing a composite body according to claim 1, wherein the polymer has a branching degree of 48% or more.

10. The method for manufacturing a composite body according to claim 1, wherein the monocarboxylic acid compound does not have a hydroxyl group or an amino group, and has a van der Waals volume of 40 $cm^3$/mol or more.

11. The method for manufacturing a composite body according to claim 1, wherein the composite member satisfies a relationship: the isoelectric point of a surface of the member B<the pH of the composition<{(the isoelectric point of a surface of the member A)−1.0}.

12. The method for manufacturing a composite body according to claim 1, the method further comprising a cleaning process of cleaning the composite member to which the composition has been applied, with a rinsing liquid at a temperature of from 15° C. to 100° C.

13. The method for manufacturing a composite body according to claim 12, wherein the rinsing liquid comprises an acid having, in one molecule, at least one of a moiety that blocks active species or a functional group that forms a bond with the polymer when heated.

14. The method for manufacturing a composite body according to claim 1, the method further comprising a high temperature heating process of heating the composite member to which the composition has been applied, under a condition of a temperature of from 200° C. to 425° C.

15. The method for manufacturing a composite body according to claim 1, wherein the composite member comprises a substrate and, on the substrate, a conductive part as the member A and an insulating layer as the member B.

16. A composition that comprises a polymer having a cationic functional group and having a weight average molecular weight of from 2,000 to 1,000,000 and a branching degree of 48% or more, and a monocarboxylic acid compound, and that has a pH of from 2.0 to 11.0, wherein a content of sodium and a content of potassium in the composition are each 10 ppb by mass or less, on an elemental basis.

17. The composition according to claim 16, being a semiconductor sealing composition.

* * * * *